United States Patent
Kim et al.

(10) Patent No.: US 9,548,025 B2
(45) Date of Patent: Jan. 17, 2017

(54) CAPACITOR, DRIVING CIRCUIT COMPRISING THE CAPACITOR, AND DISPLAY DEVICE COMPRISING THE DRIVING CIRCUIT

(71) Applicant: Samsung Display Co., Ltd., Yongin (KR)

(72) Inventors: Tae-Joon Kim, Yongin (KR); Min-Kyu Woo, Yongin (KR); Yang-Wan Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 152 days.

(21) Appl. No.: 14/054,125

(22) Filed: Oct. 15, 2013

(65) Prior Publication Data

US 2014/0368414 A1    Dec. 18, 2014

(30) Foreign Application Priority Data

Jun. 12, 2013 (KR) .......................... 10-2013-0067172

(51) Int. Cl.
*G09G 3/30* (2006.01)
*G09G 3/32* (2016.01)
(Continued)

(52) U.S. Cl.
CPC ............ *G09G 3/3266* (2013.01); *H01G 4/005* (2013.01); *H01L 27/1255* (2013.01); *G09G 2300/0861* (2013.01); *G09G 2320/0233* (2013.01)

(58) Field of Classification Search
CPC .... G09G 3/3266; H01G 4/005; H01L 27/1255
See application file for complete search history.

(56) References Cited

U.S. PATENT DOCUMENTS

2010/0014013 A1* 1/2010 Park .................. G02F 1/136286
                                                              349/39
2010/0110050 A1* 5/2010 Park ..................... G09G 3/3266
                                                              345/205

(Continued)

FOREIGN PATENT DOCUMENTS

EP      1763003      3/2007
EP      2498242      9/2012
(Continued)

OTHER PUBLICATIONS

European Search Report issued on Nov. 6, 2014 in European Patent Application 14162639.0.
(Continued)

*Primary Examiner* — Kumar Patel
*Assistant Examiner* — Insa Sadio
(74) *Attorney, Agent, or Firm* — H.C. Park & Associates, PLC

(57) ABSTRACT

According to exemplary embodiments of the present disclosure, a capacitor may be connected to a gate electrode of a transistor. The capacitor includes a first gate electrode connected to the gate electrode of the transistor, a gate insulation layer formed on the first gate electrode, and an upper electrode formed on the gate insulation layer. The upper electrode is formed to cover a region where the first gate electrode and the upper electrode are overlapped. The capacitor is applicable to at least one of a light emitting driving circuit and a scan driving circuit, and at least one of the light emitting driving circuit and the scan driving circuit may be included in a display device.

9 Claims, 14 Drawing Sheets

(51) Int. Cl.
    *H01L 27/12*     (2006.01)
    *H01G 4/005*     (2006.01)

(56) References Cited

U.S. PATENT DOCUMENTS

| | | |
|---|---|---|
| 2011/0025679 A1 | 2/2011 | Park |
| 2011/0109599 A1 | 5/2011 | Han |
| 2011/0298771 A1* | 12/2011 | Yoo .......................... G09G 3/20 |
| | | 345/211 |
| 2012/0062545 A1 | 3/2012 | Kim |
| 2012/0112652 A1 | 5/2012 | Wang et al. |
| 2013/0002616 A1 | 1/2013 | Kim et al. |
| 2013/0127924 A1 | 5/2013 | Lee |
| 2013/0153941 A1 | 6/2013 | Sasaki et al. |

FOREIGN PATENT DOCUMENTS

| | | |
|---|---|---|
| KR | 10-2005-0037657 | 4/2005 |
| KR | 10-2008-0000205 | 1/2008 |
| KR | 10-2008-0046009 | 5/2008 |
| WO | 2007080813 | 7/2007 |
| WO | 2012029671 | 3/2012 |

OTHER PUBLICATIONS

Extended European Search Report issued on Mar. 6, 2015, in European Patent Application No. 14162639.0.

\* cited by examiner

CAPACITOR, DRIVING CIRCUIT COMPRISING THE CAPACITOR, AND DISPLAY DEVICE COMPRISING THE DRIVING CIRCUIT

CROSS REFERENCE TO RELATED APPLICATION

This application claims priority from and the benefit of Korean Patent Application No. 10-2013-0067172, filed on Jun. 12, 2013, which is hereby incorporated by reference for all purposes as if fully set forth herein.

BACKGROUND

Field

Exemplary embodiments of the present disclosure relate to a capacitor, a driving circuit including the capacitor, and a display device including the driving circuit.

Discussion of the Background

A display device may include a driving circuit for generating a plurality of scan signals or light emission control signals. The display device may include a plurality of pixels, and each of the pixels may include a light emitting element.

The driving circuit may generate a plurality of scan signals having gate-on levels to provide gray voltages to a plurality of pixels. In addition to providing the gray voltages, the driving circuit may generate a plurality of light emission control signals having gate-on levels.

The driving circuit may include a transistor in which a capacitor is connected between a gate and a source thereof. A parasitic capacitance may be generated by the structure of the capacitor. The voltage supplied to the gate of the transistor may be affected by the parasitic capacitance.

If the gate voltage of the transistor is affected by the parasitic capacitance, an operation of the transistor may be different from the theoretical operation of the transistor. This may cause a difference between a target voltage and the gate-on level of the light emission control signal or the gate-on level of the scan signal as an output of the driving circuit.

When an image is displayed according to an image signal inputted into the display device, such voltage error may cause serious image quality deterioration.

The above information disclosed in this Background section is only for enhancement of understanding of the background of the disclosed subject matter and therefore may contain information that does not form any part of the prior art nor what the prior art may suggest to a person of ordinary skill in the art.

SUMMARY

Exemplary embodiments of the present disclosure provide a capacitor, a driving circuit including the capacitor, and a display device including the driving circuit, having advantages of being capable of minimizing an effect of parasitic capacitance.

Additional features of the present disclosure will be set forth in the description which follows, and in part will be apparent from the description, or may be learned by practice of the disclosed subject matter.

Exemplary embodiments of the present disclosure disclose a light emitting driving circuit including a plurality of unit light emitting driving circuits configured to provide light emission control signals. At least one of the unit light emitting driving circuits includes a first capacitor having a first upper electrode comprising a first terminal connected to a gate terminal of a first transistor connected to a node configured to provide a first light emission control signal. The first transistor is configured to set the first light emission control signal to a first level according to a first light emitting clock signal received at a first lower electrode comprising a second terminal of the first capacitor. The first upper electrode has an area greater than a first overlap area. The first overlap area is an area where the first lower electrode and the first upper electrode overlap.

Exemplary embodiments of the present disclosure disclose a light emitting driving circuit including a plurality of unit light emitting driving circuits configured to provide light emission control signals. At least one of the unit light emitting driving circuits includes a first transistor and a first capacitor. The first transistor has a gate terminal connected to a node providing a first input. The first input is provided from a unit light emitting driving circuit located in an adjacent stage of the unit light emitting driving according to a second light emitting clock signal. The first transistor has a first terminal configured to receive a first light emitting clock signal. The first capacitor is connected between the gate terminal of the first transistor and a second terminal of the first transistor. The first capacitor includes a first upper electrode and a first lower electrode. The first upper electrode has an area greater than a first overlap area. The first overlap area is an area where the first lower electrode and the first upper electrode overlap.

Exemplary embodiments of the present disclosure disclose a light emitting driving circuit including a plurality of unit light emitting driving circuits configured to provide light emission control signals. At least one of the unit light emitting driving circuit includes a first capacitor, a first transistor, a second transistor, and a second capacitor. The first capacitor has a first terminal coupled to a node providing a light emission control signal. The second transistor has a first terminal coupled to a gate terminal of the first transistor and a second terminal configured to receive a first light emitting reset signal. The second capacitor is connected between a gate terminal of the second transistor and the first terminal of the second transistor. The second capacitor includes a second upper electrode and a second lower electrode. The second upper electrode has an area greater than an overlap area. The overlap area is an area where the second lower electrode and the second upper electrode overlap.

Exemplary embodiments of the present disclosure disclose a scan driving circuit including a plurality of unit scan driving circuits configured to provide scan signals. At least one of the unit scan driving circuits includes a first transistor and a first capacitor. The first transistor has a gate terminal coupled to a node configured to receive a first input. The first input is provided according to a first clock signal. The first transistor has a first terminal configured to receive a second clock signal. The first capacitor is connected between the gate terminal of the first transistor and a second terminal of the first transistor. The first capacitor includes a first upper electrode and a first lower electrode. The first upper electrode has an area greater than a first overlap area. The first overlap area is an area where the first lower electrode and the first upper electrode overlap. The first input is provided from a unit scan driving circuit adjacent to the at least one of the unit scan driving circuits.

Exemplary embodiments of the present disclosure disclose a capacitor including a first electrode, an insulation layer, and a second electrode. The first electrode is connected to a gate electrode of a transistor. The insulation layer is disposed on the first electrode. The second electrode is disposed on the insulation layer. The second electrode has an area greater than an overlap area. The overlap area is an area where the first electrode and the second electrode overlap.

Exemplary embodiments of the present disclosure disclose a display device including a plurality of pixels controlled by a plurality of light emission control signals; and a light emitting driving circuit including a plurality of unit light emitting driving circuits configured to provide the light emission control signals. At least one of the unit light emitting driving circuits includes at least one transistor and at least one capacitor connected to the at least one transistor. The at least one capacitor includes a first electrode connected to a gate electrode of the at least one transistor, an insulation layer disposed on the first electrode, and a second electrode disposed on the insulation layer. The second electrode has an area greater than an overlap area. The overlap area is an area where the first electrode and the second electrode overlap.

Exemplary embodiments of the present disclosure disclose a display device including a plurality of pixels configured to receive data signals according to a plurality of scan signals; and a scan driving circuit including a plurality of unit scan driving circuits configured to provide the scan signals. At least one of the unit scan driving circuits includes at least one transistor and at least one capacitor connected to the at least one transistor. The at least one capacitor includes: a first electrode, an insulation layer disposed on the first electrode, and a second electrode disposed on the insulation layer. The first electrode includes a gate electrode of the at least one transistor. The second electrode has an area greater than an overlap area. The overlap area is an area where the first electrode and the second electrode overlap.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate exemplary embodiments of the disclosed subject matter, and together with the description serve to explain the principles of the disclosed subject matter.

DETAILED DESCRIPTION OF THE ILLUSTRATED EMBODIMENTS

Figure 1:
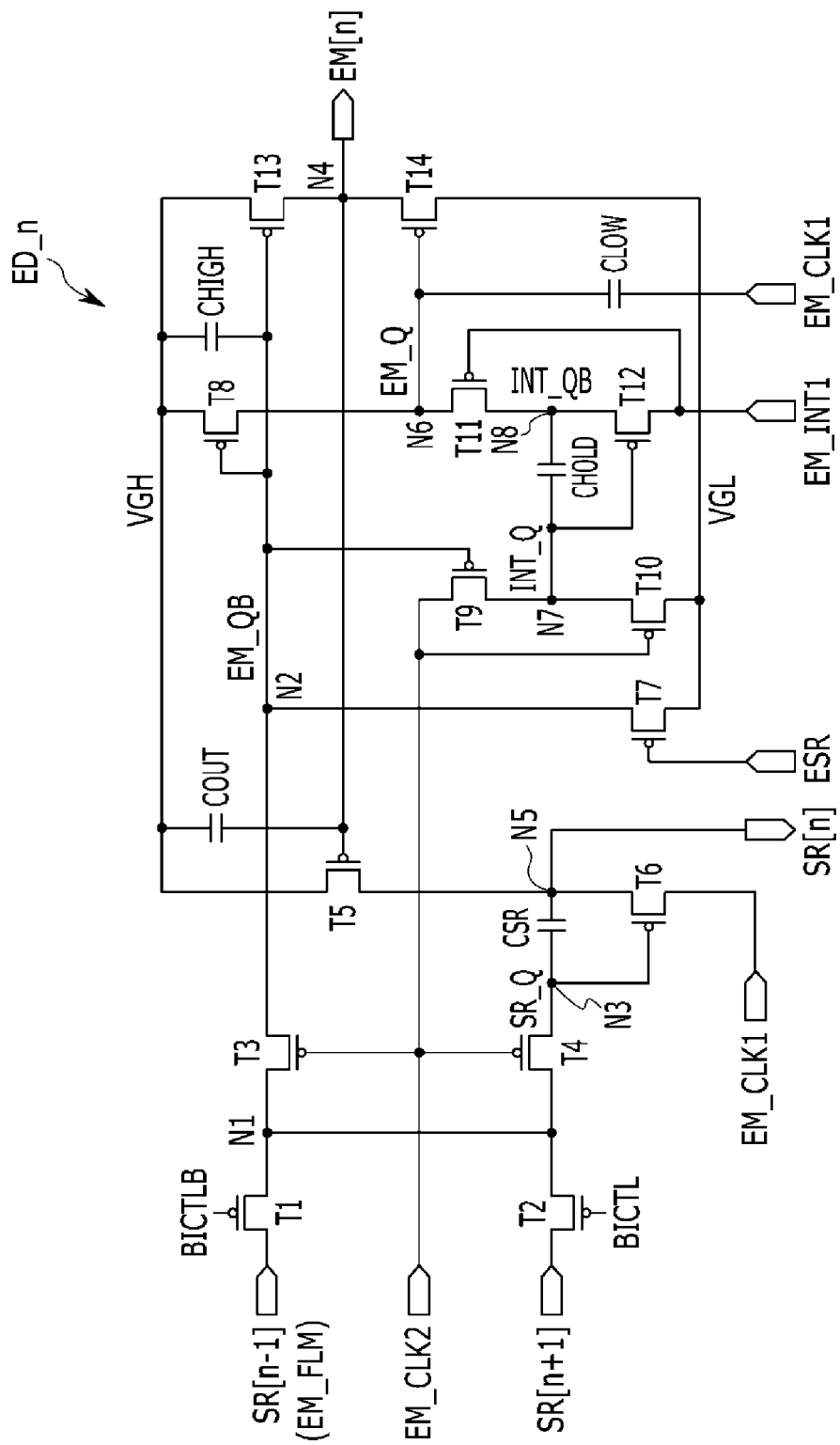
FIG. 1 shows a stage of a light emitting driving circuit according to exemplary embodiments of the present disclosure.

Exemplary embodiments of the disclosed subject matter are described more fully hereinafter with reference to the accompanying drawings. The disclosed subject matter may, however, be embodied in many different forms and should not be construed as limited to the exemplary embodiments set forth herein. Rather, the exemplary embodiments are provided so that this disclosure is thorough and complete, and will convey the scope of the disclosed subject matter to those skilled in the art. In the drawings, the size and relative sizes of layers and regions may be exaggerated for clarity. Like reference numerals in the drawings denote like elements.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the disclosed subject matter are described herein with reference to cross-section illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, exemplary embodiments of the disclosed subject matter should not be construed as limited to the particular shapes of regions illustrated herein but are to include deviations in shapes that result, for example, from manufacturing.

Hereinafter, exemplary embodiments of the disclosed subject matter will be described in detail with reference to the accompanying drawings. A light emitting driving circuit and a display device including same will be described with reference to the drawings in accordance with exemplary embodiments of the present disclosure. A light emitting clock, a clock, a light emitting reset signal, an SR output, and an SSR output are formed of a pulse waveform having a predetermined period.

FIG. 1 shows one stage ED_n of a light emitting driving circuit according to exemplary embodiments of the present disclosure.

The light emitting driving circuit includes a plurality of stages arranged in series. Each of the stages (e.g., an $n^{th}$ stage) receives SR outputs (e.g., SR[n−1] and SR[n+1]) of two stages (e.g., an $(n−1)^{th}$ stage and an $(n+1)^{th}$ stage) adjacent thereto, and outputs an SR output (e.g., SR[n]) thereof. Here, "n" may be any whole number equal to or greater than 1. A light emission control signal (e.g., EM[n]) may be output according to the SR output SR[n]. The output EM[n] shown in FIG. 1 may be used as a light emission control signal for stopping light emission for a predetermined period of time or controlling the duty of a pixel in a display device.

Hereinafter, each of a plurality of stages constituting a light emitting driving circuit is referred to as a unit light emitting driving circuit.

As shown in FIG. 1, the unit light emitting driving circuit ED_n includes a plurality of transistors T1-T14 and 5 capacitors CSR, CHOLD, COUT, CLOW, and CHIGH.

The transistors T1-T14 may be embodied using p-channel transistors. The transistors T1-T14 perform switching operations according to signals inputted into their respective gates serving as control electrodes. When the gate input is at a low level, the corresponding transistor is turned on. When the gate input is at a high level, the transistor is turned off. However, exemplary embodiments are not limited thereto. For example, in some cases, any other suitable type of transistor may be used.

Transistor T1 has a first terminal (e.g., source) connected to a SR output SR[n−1] of a unit light emitting driving circuit (not shown) of a previous stage ED_n−1, a gate terminal connected to a node providing a first direction control signal BICTLB, and a second terminal (e.g., drain) connected to a node N1.

When the unit light emitting driving circuit ED_n is a first stage, a light emitting start signal EM_FLM is used instead of the SR output SR[n−1] of the light emitting driving circuit of the previous stage ED_n−1.

Transistor T2 has a first terminal connected to a SR output SR[n+1] of the unit light emitting driving circuit (not shown) of a next stage ED_n+1, a gate terminal connected to a node providing a second direction control signal BICTLB, and a second terminal connected to the node N1.

When the first direction control signal BICTLB is at a gate-on level, the second direction control signal BICTL is at a gate-off level. When the first direction control signal BICTLB is at the gate-off level, the second direction control signal BICTL is at the gate-on level. Accordingly, it can be appreciated that the first direction control signal BICTLB may be complementary to the second direction control signal BICTL.

Transistor T3 has a first terminal connected to the node N1, a gate terminal connected to a node providing a second light emitting clock signal EM_CLK2, and a second terminal connected to a node N2. Transistor T4 has a first terminal connected to the node N1, a gate terminal connected to a node providing the second light emitting clock signal EM_CLK2, and a second terminal connected to a node N3.

Transistor T5 has a first terminal connected to a node providing a first power source voltage VGH, a gate terminal connected to node N4, and a second terminal connected to a node N5. The output capacitor COUT is connected between the node N4 and the node providing the first power source voltage VGH.

Transistor T6 has a first terminal connected to a node providing a first light emitting clock signal EM_CLK1, a gate terminal connected to the node N3, and a second terminal connected to the node N5. A SR capacitor CSR is connected between the second terminal and the gate terminal of the transistor T6. The first light emitting clock signal EM_CLK1 may be output as the SR output SR[n] when the transistor T6 is turned on, and the first power source voltage VGH may be output as the SR output SR[n] when the transistor T5 is turned on.

Transistor T7 has a first terminal connected to the node N2, a gate terminal connected to a node providing a light emitting stop signal ESR, and a second terminal connected to a node providing a second power source voltage VGL. Transistor T8 has a first terminal connected to the node providing the first power source voltage VGH, a gate terminal connected to the node N2, and a second terminal connected to a node N6.

Transistor T9 has a first terminal connected to a node providing the second light emitting clock signal EM_CLK2, a gate terminal connected to the node N2, and a second terminal connected to a node N7. Transistor T10 has a first terminal connected to the node N7, a gate terminal connected to the second light emitting clock signal EM_CLK2, and a second terminal connected to a node providing the second power source voltage VGL.

Transistor T11 has a first terminal connected to the node N6, a gate terminal connected to a node providing a first light emitting reset signal EM_INT1, and a second terminal connected to a node N8.

Transistor T12 has a first terminal connected to the node N8, a gate terminal connected to the node N7, and a second terminal connected to the first light emitting reset signal EM_INT1. A hold capacitor CHOLD is connected to the gate terminal and the first terminal of the transistor T12.

Transistor T13 has a first terminal connected to the node providing the first power source voltage VGH, a gate terminal connected to the node N2, and a second terminal connected to the node N4. A high capacitor CHIGH is connected between the node providing the first power source voltage VGH and the node N2.

Transistor T14 has a first terminal connected to the node N4, a gate terminal connected to the node N6, and a second terminal connected to the node providing the second power source voltage VGL. A low capacitor CLOW has a first electrode connected to the node N6 and a second electrode connected to a node receiving a first light emitting clock signal EM_CLK1.

It should be appreciated that in the above-noted description of the transistors T1-T14, the first terminals of the transistors may be a source or drain and the second terminals may be a drain or source, respectively. For example, if the first terminal is a source terminal, then the second terminal is a drain terminal, and vice-versa. In some cases, a unit light emitting driving circuit of a previous stage ED_n−1 or of a next stage ED_n+1 may have different connections compared to the unit light emitting driving circuit stage ED_n shown in FIG. 1. In some cases, the unit light emitting driving circuit of the previous stage ED_n−1 or of the next stage ED_n+1 may have the same connections as the unit light emitting driving circuit stage ED_n shown in FIG. 1.

For example, in the unit light emitting driving circuit of the previous stage ED_n−1 or the next stage ED_n+1, a second light emitting clock signal EM_CLK2 may be connected to a transistor corresponding to the transistor T6 instead of the first light emitting clock signal EM_CLK1, and the second light emitting reset signal EM_INT2 may be connected to a transistor corresponding to the transistor T2 instead of the first light emitting reset signal EM_INT1. Further, the second light emitting clock signal EM_CLK2 may be connected to a low capacitor CLOW instead of the first light emitting clock signal EM_CLK1.

Hereinafter, an operation of the unit light emitting driving circuit ED_n will be described with reference to FIG. 2 according to exemplary embodiments of the present disclosure.

As noted above, the transistors of the unit light emitting driving circuit ED_n in FIG. 1 are p-channel transistors. Accordingly, an enable level for turning on the transistors is a low level, and a disable level for turning off the switching elements is a high level. A low level may correspond to a low reference voltage, such as 0V. A high level may correspond to a higher reference voltage (such as 1V or 3V) relative to the low reference voltage. Also, for the purposes of this disclosure, when a signal or node is described as being at a low level or high level, it should be understood that the voltage at the node (or provided by the signal) is at a low voltage or high voltage, respectively. In addition, if a signal or node is described as being at a midlevel, it should be understood that the voltage at the node (or provided by the signal) is between the low and high reference voltages.

Figure 2:
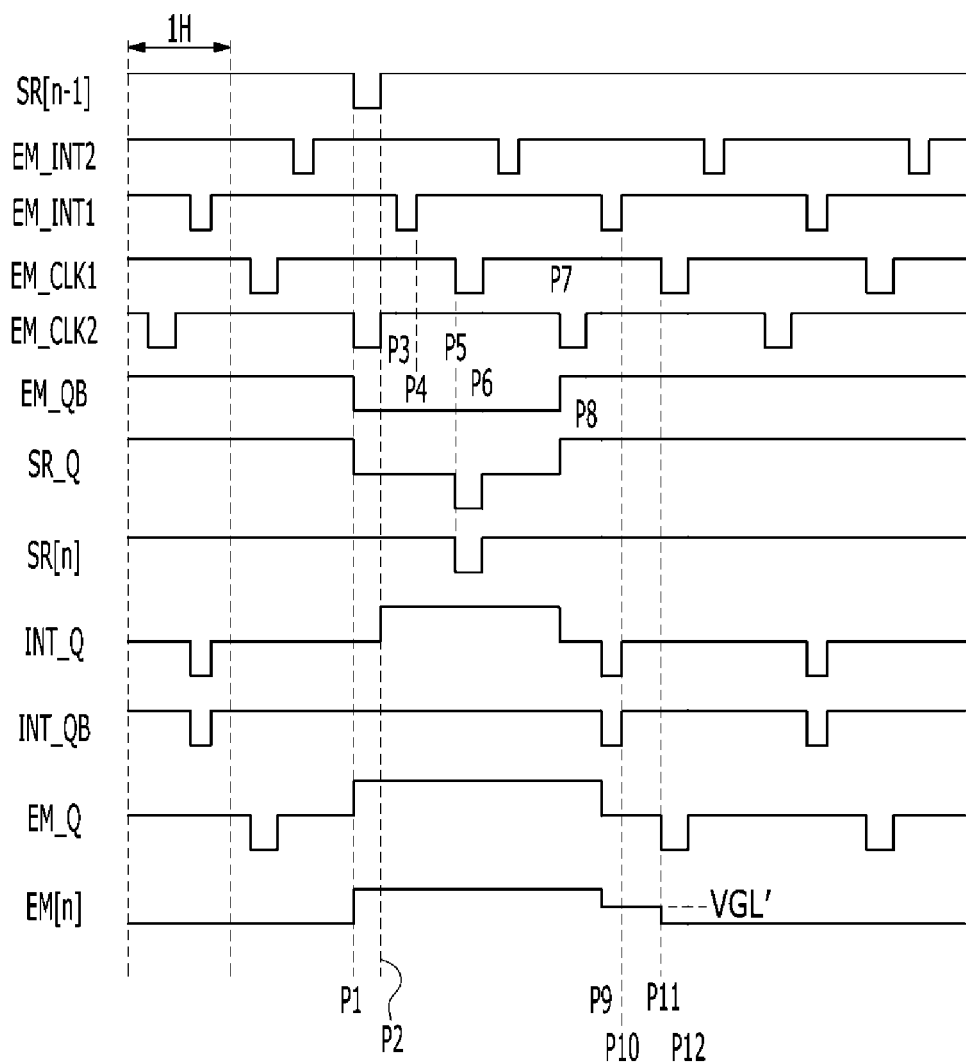
FIG. 2 is a waveform diagram showing voltages of nodes and inputs and outputs of a unit light emitting driving circuit according to exemplary embodiments of the present disclosure.

FIG. 2 is a waveform diagram showing voltages of nodes and inputs and outputs of a unit light emitting driving circuit ED_n according to exemplary embodiments of the present disclosure.

A voltage at the node N5 corresponds to SR output SR[n], and a voltage at the node N4 corresponds to the light emission control signal EM[n]. The voltages of the nodes N2, N3, N6, N7, and N8 correspond to EM_QB, SR_Q, EM_Q, INT_Q, and INT_QB, respectively.

The first direction control signal BICTLB may be assumed to be set at a low level, and that the second direction control signal BICTL may be assumed to be set at a high level. The transistor T1 is turned on by the first direction control signal BICTLB, and the transistor T2 is turned off by the second direction control signal BICTL.

At a point of time P1, the SR output SR[n−1] and the second light emitting clock signal EM_CLK2 are decreased to a low level, and the transistors T3 and T4 are turned on to decrease EM_QB and SR_Q to a low level. Since EM_QB is at a low level, the transistor T13 is turned on and EM_Q and the light emission control signal EM[n] are increased to a high level.

At a point of time P2, the second light emitting clock signal EM_CLK2 is increased to a high level, so that the transistors T3 and T4 are turned off. For a period from P1 to P2, the SR output SR[n−1] having a low level is applied to the node N2 and the high capacitor CHIGH connected to the node N2. Accordingly, EM_QB is maintained at a low level until a point of P7 after which the second light emitting clock signal EM_CLK2 is decreased to a low level.

For the period from P1 to P2, the transistor T10 is turned on by the second light emitting clock signal EM_CLK2, so that INT_Q is at a low level. When the second light emitting clock signal EM_CLK2 is at a high level, the transistor T10 is turned off. Accordingly, after point of time P2, the second light emitting clock EM_CLK2 may be at a high level and may be provided to the node N7 through the transistor T9 that is turned on by EM_QB, so that INT_Q is increased to a high level.

For the period from P1 to P2, the transistor T12 is turned on by INT_Q having a low level, so that the first light emitting reset signal EM_INT1 is connected to the node N8. Accordingly, INT_QB is at a high level. After the transistor T10 is turned off (after the point of time P2), INT_Q is increased to a high level, so that the transistor T12 is turned off. For the period from P2 to P7, the transistor T9 is turned on by EM_QB having a low level. Accordingly, INT_Q is maintained at a high level, so that the transistor T12 is turned off.

At a point of time P3, the first light emitting reset signal EM_INT1 is decreased to a low level, and the transistor T11 is turned on. INT_QB is connected to node EM_Q and the node providing the first power source voltage VGH that is maintained at a high level. At a point of time P4, the first light emitting reset signal EM_INT1 is increased to a high level, and the transistor T11 is turned off. INT_QB is maintained at a high level by the hold capacitor CHOLD.

At a point of time P5, the first light emitting clock EM_CLK1 is decreased to a low level, and SR output SR[n] is decreased to a low level. The voltage of the node N3 coupled to the node N5 through the SR capacitor CSR is also decreased. Accordingly, as shown in FIG. 2, SR_Q is decreased at the point of time P5.

At a point of time P6, the first light emitting clock EM_CLK1 is increased to a high level, and the SR output SR[n] is increased to a high level. The voltage of the node N3 coupled to the node N5 through the SR capacitor CSR is also increased. Accordingly, as shown in FIG. 2, SR_Q is increased at the point of time P6.

At a point of time P7, the second light emitting clock EM_CLK2 is decreased to a low level, and the transistor T3 and transistor T4 are turned on. At the point of time P7, the SR output SR[n−1] is at a high level. Accordingly, EM_QB and SR_Q are increased to a high level. Then, the transistors T6, T8, and T13 are turned off.

After the point of time P7 (although the transistor T6 is turned off), a first end of the SR capacitor CSR is provided with the SR output SR[1] having a high level, so that the SR output SR[n] is maintained at a high level. Moreover, the node N6 is coupled to the first light emitting clock EM_CLK1 through the low capacitor CLOW, and the first light emitting clock EM_CLK1 is maintained at a high level at the point of time P7. Accordingly, EM_Q is also maintained at a high level.

At the point of time P7, the transistor T10 is turned on by the second light emitting clock EM_CLK2, so that INT_Q is decreased to a low level, and the transistor T12 is turned on. At the point of time P7, since the first light emitting reset signal EM_INT1 is at a high level, INT_QB is maintained at a high level.

At a point of time P8, the second light emitting clock EM_CLK2 is increased to a high level, and the transistors T3 and T4 are turned off.

At a point of time P9, the first light emitting reset signal EM_INT1 is decreased to a low level, and the transistor T11 is turned on. At the point of time P9, the transistor T12 is turned on, so that INT_QB is decreased to a low level. The voltage at INT_Q may be decreased by the coupling of the hold capacitor CHOLD.

Since the node N6 is connected to the first light emitting reset signal EM_INT1 through the transistor T11 that is turned on, EM_Q is also decreased to a midlevel. Since EM_Q is at a midlevel, a reduced voltage level may be provided to the gate of the transistor T14, so that the transistor T14 is turned on. However, since the first light emitting clock EM_CLK1 is still at a high level at point of time P9, the transistor T14 is not fully turned on, the light emission control signal EM[n] is decreased to a voltage VGL' that is higher than the second power source voltage VGL.

At a point of time P10, the first light emitting reset signal EM_INT1 is increased to a high level, and the transistor T11 is turned off. At the point of time P10, since the transistor T12 is turned on, a voltage at INT_QB is increased to a high level and a voltage at INT_Q is increased by the coupling of the hold capacitor CHOLD.

The EM_Q is maintained at a low level through the low capacitor CLOW, and the light emission control signal EM[n] is also maintained at VGL'.

At the point of time P11, the voltage at first light emitting clock EM_CLK1 is decreased to a low level, and a voltage at EM_Q coupled to the first light emitting clock EM_CLK1 through the low capacitor CLOW is also decreased. Then, EM_Q is decreased to a lower voltage, i.e., a voltage level at which the transistor T14 is fully turned on.

Accordingly, at the point of time P11, the light emission control signal EM[n] is decreased to a level of the second power source voltage VGL.

Hereinafter, a layout of the unit light emitting driving circuit ED_n will be described with reference to FIG. 3 according to exemplary embodiments of the present disclosure.

Figure 3:
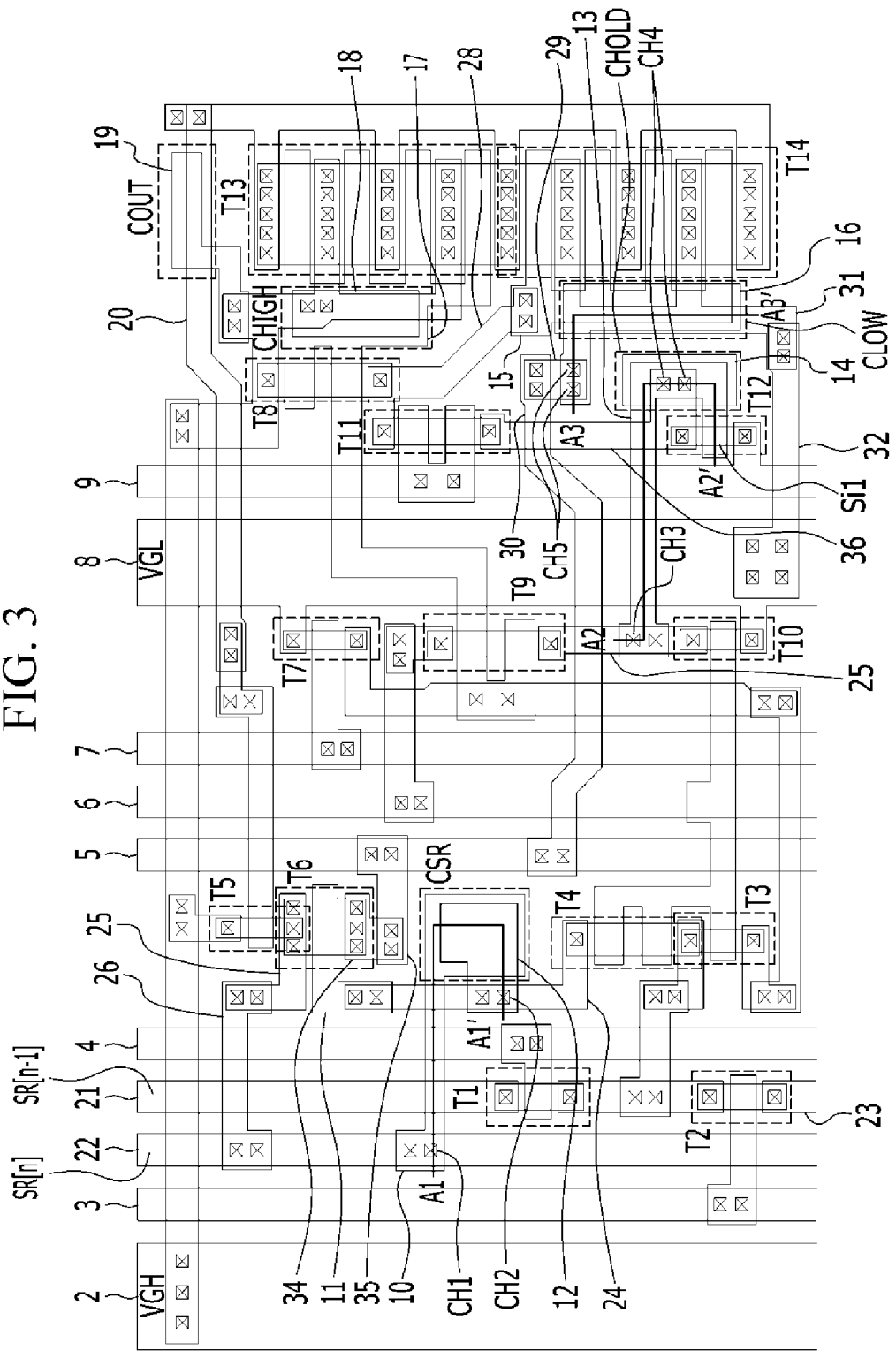
FIG. 3 is a plan layout of a unit light emitting driving circuit according to exemplary embodiments of the present disclosure.

FIG. 3 is a plan layout of a unit light emitting driving circuit ED_n according to exemplary embodiments of the present disclosure. In FIG. 3, the regions at which the transistors T1-T14 are formed are indicated by dotted lines and the reference numerals T1-T14. In FIG. 3, boxes indicated by "x" correspond to contact holes.

The first power source voltage VGH is supplied through a wire 2, and the previous SR output SR[n−1] is supplied to a wire 21 through an wire 23 and an electrode 24. The second direction control signal BICTL is supplied through a wire 3, and the first direction control signal BICTLB is supplied through a wire 4.

The current SR output SR[n] of the unit light emitting driving circuit ED_n is supplied though a wire 22, and the SR output SR[n+1] of a next unit light emitting driving circuit ED_n+1 (not shown) is supplied through a wire 23.

The first light emitting clock signal EM_CLK1, the second light emitting clock signal EM_CLK2, the light emitting stop signal ESR, the second power source voltage VGL, and the first light emitting reset signal EM_INT1 are respectively supplied through a wire 5, a wire 6, a wire 7, a wire 8, and a wire 9.

A gate electrode 11 of the transistor T6 is connected to an electrode 24 through the corresponding contact hole, and an electrode 34 (e.g., a drain electrode) of the transistor T6 is connected to an electrode 35. The electrode 35 is connected to the wire 5 to which the first light emitting clock EM_CLK1 is connected through the corresponding contact hole.

The electrode 24 is connected to a gate electrode 12 through the corresponding contact hole, and the second end of the transistor T4 is connected to the electrode 24 through the corresponding contact hole.

An electrode 25, connected to the second end of the transistor T5 and the first end of the transistor T6, is connected to an electrode 26 through the corresponding contact hole. A wire 22 is connected to the electrode 26 through a contact hole. The SR output SR[n] of the unit light emitting driving circuit ED_n is outputted through the wire 22. The node N5 shown in FIG. 1 may be formed of the electrodes 25 and 26, and the second end of the transistor T5 and the first end of the transistor T6 may be a drain and a source, respectively.

The SR capacitor CSR includes the gate electrode 12 serving as a lower electrode and an electrode 10 serving as an upper electrode. The electrode 10 is connected to electrode 22 through a contact hole. The gate electrode 11 and the gate electrode 12 may be formed in the same layer.

Hereinafter, a sectional surface of the SR capacitor CSR will be described with reference to FIG. 4 according to exemplary embodiments of the present disclosure.

Figure 4:
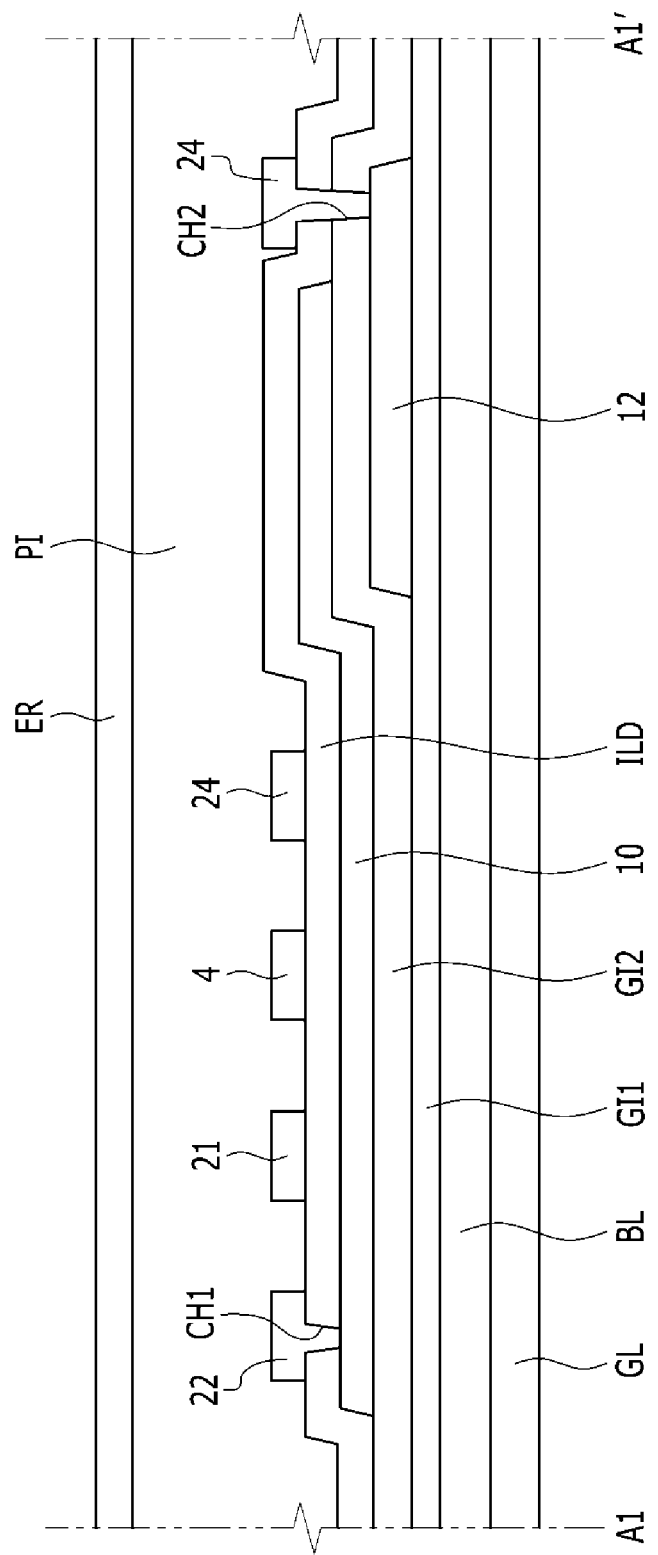
FIG. 4 is a cross-sectional view taken along line A1-A1' of FIG. 3 showing a layer structure according to exemplary embodiments of the present disclosure.

FIG. 4 is a cross-sectional view taken along line A1-A1' of FIG. 3 showing a layer structure.

As shown in FIG. 4, a buffer layer BL is formed on a glass substrate GL, and a gate insulation layer GI1 is formed on the buffer layer BL. A gate electrode 12 serving as a lower electrode is formed on the gate insulation layer GI1, and a gate insulation layer GI2 is formed on the gate insulation layer GI1 and the gate electrode 12. The electrode 10 serving as the upper electrode is formed on the gate insulation layer GI2.

An interlayer insulating layer ILD is formed on the electrode 10 and the gate insulation layer GI2. The wire 22 is connected to the electrode 10 through a contact hole CH1, and the electrode 24 is connected to the gate electrode 12 through a contact hole CH2. The wires 4 and 21 and the electrode 24 are formed on the interlayer insulating layer ILD. A protective layer PI may be made of an organic film and formed on the interlayer insulating layer ILD and the wires 4, 21, 22, and 24. A transparent electrode of the pixel or a cathode electrode of the light emitting element is formed on the protective layer PI. In FIG. 4, a member indicated by a reference numeral "ER" may be a cathode electrode or a pixel electrode of the pixel.

As shown in FIG. 4, the SR capacitor CSR may be formed at a region where the electrode 10 and the gate electrode 12 are overlapped. As shown in FIG. 3 and FIG. 4, the electrode 10 serving as the upper electrode is formed at a greater area than an overlapping area of the electrode 10 and the gate electrode 12. The SR capacitor CSR shown in FIG. 3 and FIG. 4 is an example of a structure capable of reducing parasitic capacitance.

It should be understood that exemplary embodiments of the present disclosure are not limited to the structures shown in FIG. 3 and FIG. 4, and numerous variations are possible in which the upper electrode 10 of the SR capacitor CSR is formed at a greater area than the overlap area of the upper electrode 10 and the lower electrode 12.

Referring to FIG. 3 again, the hold capacitor CHOLD includes a gate electrode 13 serving as a lower electrode and an electrode 14 serving as an upper electrode. The gate electrode 13 is connected to an electrode 25 through a contact hole to form the gate of the transistor T12. The electrode 25 is connected to a source of the transistor T10 through a contact hole and to the second end of the transistor T9 through another contact hole. The electrode 25 is also connected to the gate electrode 13 through a contact hole CH3. The node N7 shown in FIG. 1 is formed as the electrode 25, and the first end of the transistor T10 is the source.

The electrode 14 serving as an upper electrode is connected to an electrode 26. The electrode 36 is connected to the first end of the transistor T12 through a contact hole and the second end of the transistor T11 through another contact hole. The node N8 shown in FIG. 1 is formed as the electrode 36.

Hereinafter, a sectional surface of the hold capacitor CHOLD will be described with reference to FIG. 5 according to exemplary embodiments of the present disclosure.

Figure 5:
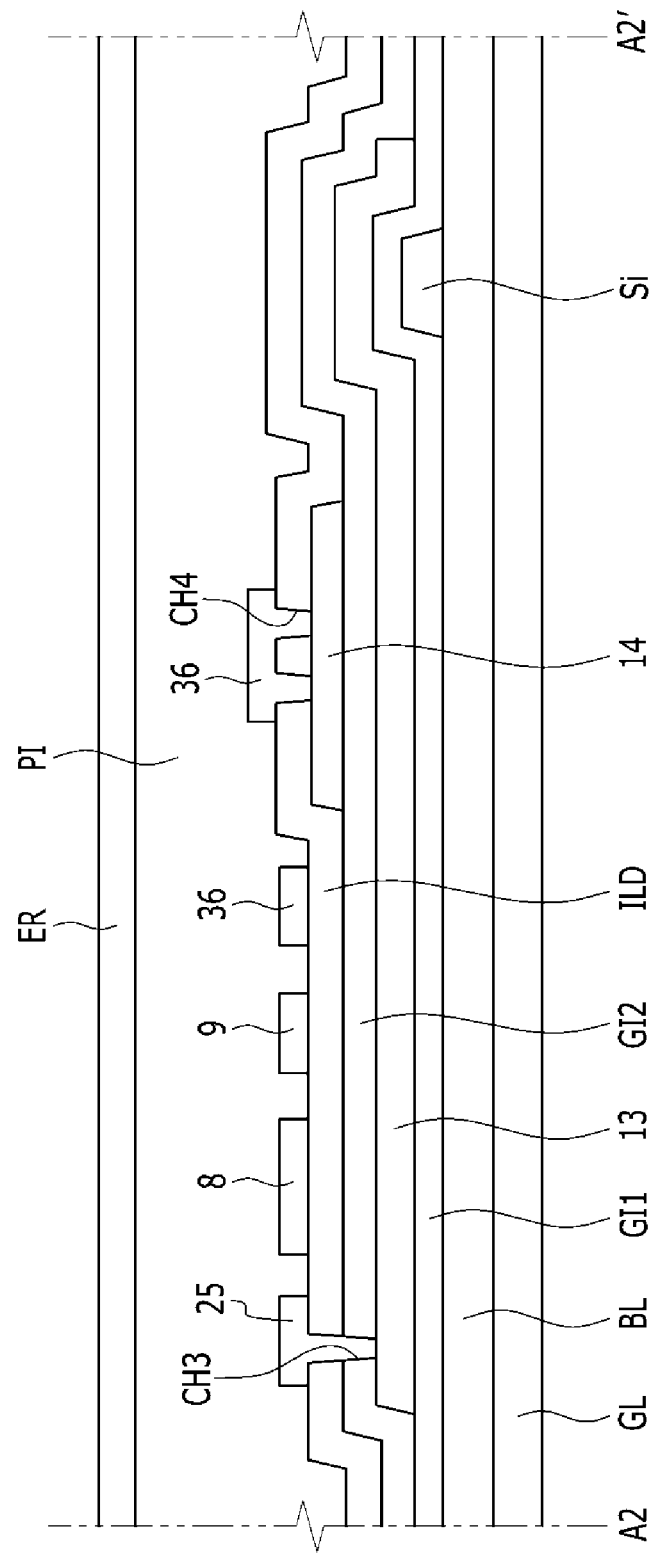
FIG. 5 is a cross-sectional view taken along line A2-A2' of FIG. 3 showing a stacked structure according to exemplary embodiments of the present disclosure.

FIG. 5 is a cross-sectional view taken along line A2-A2' of FIG. 3 shows a stacked structure.

As shown in FIG. 5, a buffer layer BL is formed on a glass substrate GL, and a gate insulation layer GI1 and a semiconductor layer Si are formed on a buffer layer BL. A gate electrode 13 serving as a lower electrode is formed on the gate insulation layer GI1, and a gate insulation layer GI2 is formed on the gate insulation layer GI1 and the gate electrode 13. An electrode 14 serving as an upper electrode is formed on the gate insulation layer GI2.

An interlayer insulating layer ILD is formed on the electrode 14 and the gate insulation layer GI2. An electrode 25 is connected to the gate electrode 13 through a contact hole CH3, and an electrode 36 is connected to the electrode 14 through a contact hole CH4. Wires 8 and 9 and the electrode 36 are formed on the interlayer insulating layer ILD. A protective layer PI that may be made of an organic film is formed on the interlayer insulating layer ILD and the electrodes 8, 9, 25, and 36. A transparent electrode of the pixel or a cathode electrode of the light emitting element is formed on the protective layer PI. In FIG. 5, a member indicated by a reference numeral 'ER' may be a cathode electrode or a pixel electrode of the pixel.

As shown in FIG. 5, the hold capacitor CHOLD is formed on a region where the gate electrode 13 and the electrode 14 are overlapped. As shown in FIG. 3, the electrode 14 serving as the upper electrode is formed at a greater area than an overlap area of the electrode 14 and the gate electrode 13. The hold capacitor CHOLD shown in FIG. 3 and FIG. 5 is an example of a structure capable of reducing parasitic capacitance.

Exemplary embodiments of the present disclosure are not limited to the structures shown in FIG. 3 and FIG. 5, and numerous variations are possible in which the upper electrode 14 of the hold capacitor CHOLD may be formed at a greater area than an overlap area of the upper electrode 14 and the lower electrode 13.

The low capacitor CLOW includes a gate electrode 15 serving as a lower electrode and an electrode 16 serving as an upper electrode. The gate electrode 15 is connected to an electrode 28 through a contact hole to form the gate of the transistor T14. The electrode 28 is connected to a drain of the transistor T8 through a contact hole. The node N6 shown in FIG. 1 is formed as the electrode 28, and the second end of the transistor T8 is the drain.

The electrode 16 is connected to an electrode 29 through a contact hole CH5. The electrode 29 is connected to an electrode 30 through a contact hole, and the electrode 30 is connected to the wire 5 through another contact hole. Since the first light emitting clock EM_CLK1 is supplied through the wire 5, the first light emitting clock EM_CLK1 is supplied to an upper electrode 16 of the low capacitor CLOW. A drain electrode 31 of the transistor T14 is connected to a gate electrode 32, and the gate electrode 32 is connected to through the wire 8.

Figure 6:
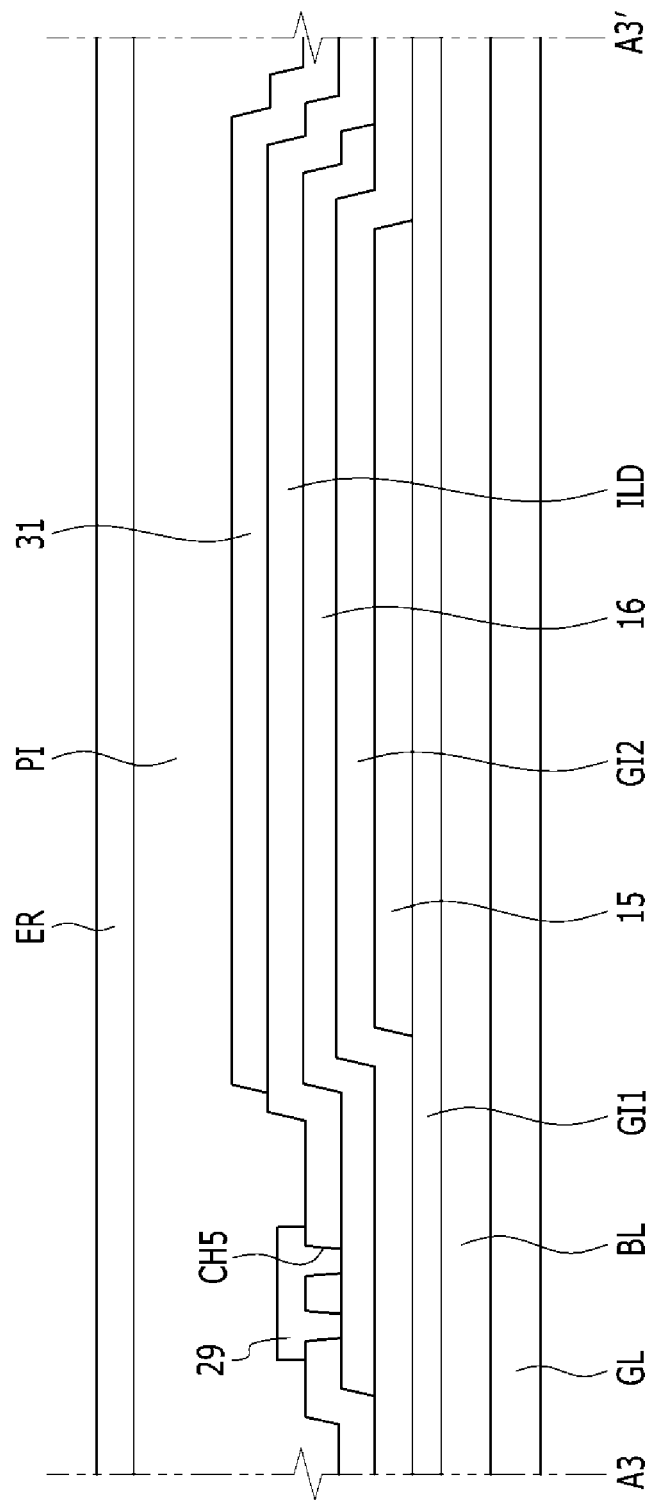
FIG. 6 is a cross-sectional view taken along line A3-A3' of FIG. 3 showing a stacked structure according to exemplary embodiments of the present disclosure.

FIG. 6 is a cross-sectional view taken along line A3-A3' of FIG. 3 showing a stacked structure.

As shown in FIG. 6, a buffer layer BL is formed on a glass substrate GL, and a gate insulation layer GI1 is formed on the buffer layer BL. A gate electrode 15 serving as a lower electrode is formed on a gate insulation layer GI1, and a gate insulation layer GI2 is formed on the gate insulation layer GI1 and the gate electrode 15. An electrode 16 serving as an upper electrode is formed on the gate insulation layer GI2.

An interlayer insulating layer ILD is formed on the electrode 16 and the gate insulation layer GI2, and the electrode 29 is connected to the electrode 16 through a contact hole CH5. An electrode 31 is formed on the interlayer insulating layer ILD. A protective layer PI may be made of an organic film and formed on the interlayer insulating layer ILD and the electrodes 29 and 31. A transparent electrode of the pixel or a cathode electrode of the light emitting element is formed on the protective layer PI. In FIG. 6, a member indicated by a reference numeral 'ER' may be a cathode electrode or a pixel electrode of the pixel.

As shown in FIG. 6, the low capacitor CLOW is formed on a region where the gate electrode 15 and the electrode 16 are overlapped. As shown in FIG. 3 and FIG. 6, the electrode 16 serving as the upper electrode may have a greater area than an overlap area of the electrode 16 and the gate electrode 15. The low capacitor CLOW shown in FIG. 3 and FIG. 6 is an example of a structure capable of reducing parasitic capacitance.

Exemplary embodiments are not limited to the structure shown in FIG. 3 and FIG. 6, and numerous variations are possible in which the upper electrode 16 of the low capacitor CLOW is formed at a greater area than an overlap area of the upper electrode 16 and the lower electrode 15.

Accordingly, the SR capacitor CSR, the hold capacitor CHOLD, and the low capacitor CLOW may be formed in such a way that the upper electrodes 10, 14, and 16 cover the gate electrodes 12, 13, and 15 at a maximum. Then, the parasitic capacitance is minimized between the gate electrodes 12, 13, and 15 and other electrode layers (electrode ER layers in FIGS. 4, 5, and 6) located thereon.

The SR output SR[n] and output of the light emission control signal EM[n] may be generated. For example, the SR output SR[n] and the light emission control signal EM[n] may be generated at a fully low level (e.g., lowest voltage level) when the SR output SR[n] and the light emission control signal EM[n] are to be input into a gate electrode of a p-channel transistor.

Specifically, the SR capacitor CSR, as shown in FIG. 2, causes the SR output SR[n] to be set at a lower voltage at point of time P5 at which the first light emitting clock EM_CLK1 is decreased. In this case, the upper electrode 10 of the SR capacitor CSR is formed to cover the gate electrode 12 at a maximum in order to prevent the boosting width of the SR output SR[n] from becoming smaller due to a diversion of the voltage variation of the first light emitting clock EM_CLK1 caused by the parasitic capacitance.

For example, as shown in FIG. 2, the hold capacitor CHOLD also causes INT_QB to be set at a lower voltage at point of time P9 at which the first light emitting reset signal EM_INT1 is decreased. In this case, the upper electrode 14 of the hold capacitor CHOLD is formed to cover the gate electrode 13 at a maximum in order to prevent the boosting width of INT_QB from becoming smaller due to a diversion of the voltage variation of the first light emitting reset signal EM_INT1 caused by the parasitic capacitance. INT_QB is fully lowered to the low voltage level to turn on the transistor T14. Accordingly, a boosting operation of the hold capacitor CHOLD is involved in the level of the light emission control signal EM[n].

In addition, as shown in FIG. 2, the low capacitor CLOW causes the light emission control signal EM[n] to be set at a lower voltage at point of time P11 at which the first light emitting clock EM_CLK1 is decreased. In this case, the upper electrode 16 of the low capacitor CLOW is formed to cover the gate electrode 15 at a maximum in order to prevent the boosting width of the light emission control signal EM[n] from becoming smaller due to a diversion of the voltage variation of the first light emitting clock EM_CLK1 caused by the parasitic capacitance.

Each upper electrode 10, 14, and 16 of the SR capacitor CSR, the hold capacitor CHOLD, and the low capacitor CLOW may have a greater area than an overlap area of the lower electrodes 12, 13, and 15 and the upper electrodes 10, 14, and 16, so as to cover the lower electrodes 12, 13, and 15 at a maximum.

Further, as shown in FIG. 3, the gate electrode 17 serving as the upper electrode of the high capacitor CHIGH may cover the electrode 18 serving as the lower electrode. The gate electrode 17 may be formed at a greater area than an overlap area of the electrodes 17 and 18. The gate electrode 20, serving as the upper electrode of the output capacitor COUT, may be formed at a greater area than an overlap area of the gate electrode 20 and the electrode 19, serving as the lower electrode of the output capacitor COUT.

As such, the exemplary embodiments include capacitors formed in such a way that an area of the upper electrode of the capacitors is formed to be larger than an overlap area of the upper electrode and the lower electrode.

Hereinafter, a driving circuit will be described with reference to FIG. 7 through FIG. 10 according to exemplary embodiments of the present disclosure.

Figure 7:
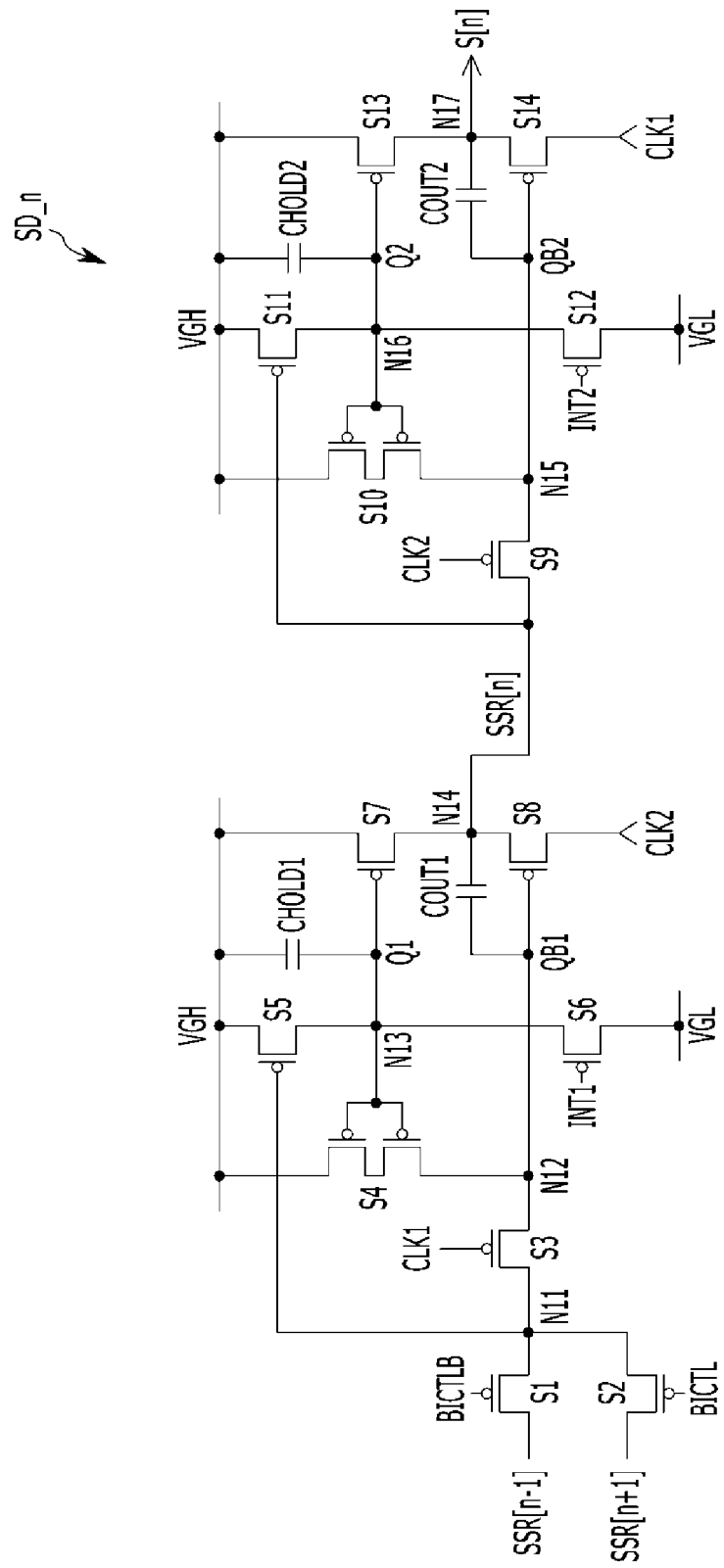
FIG. 7 shows a stage of a scan driving circuit according to exemplary embodiments of the present disclosure.

FIG. 7 shows a stage of a scan driving circuit according to exemplary embodiments of the present disclosure.

The scan driving circuit includes a plurality of stages arranged in series. Each of the stages (e.g., an $n^{th}$ stage) receives SR outputs (e.g., SR[n−1] and SR[n+1]) of two stages (e.g., an $(n−1)^{th}$ stage and an $(n+1)^{th}$ stage) adjacent thereto and outputs an SR output (e.g., SR[n]) thereof. A light emission control signal EM[n] is outputted according to the SR output SR[n]. The output S[n] of the stage SD_n shown in FIG. 7 may be used as a scan signal for providing a data signal in a pixel in a display device.

Hereinafter, each of a plurality of stages constituting a scan driving circuit is referred to as a unit scan driving circuit.

As shown in FIG. 7, the unit scan driving circuit SD_n includes a plurality of transistors S1-S14 and 4 capacitors CHOLD1, CHOLD2, COUT1, and COUT2.

In FIG. 7, the same reference numerals are used for the same elements as those described with respect to FIGS. 1-6.

All the transistors S1-S14 are embodied by p-channel transistors. The transistors S1-S14 may perform switching operations according to signals inputted into their gate terminals. When the gate input is at a low level, the transistor may be turned on. When the gate input is at a high level, the transistor may be turned off. However, exemplary embodiments of the present disclosure are not limited thereto. For example, other suitable transistors may be used in place of p-channel transistors.

The transistor S1 has a first terminal connected to an SR output SSR[n−1] of a unit light emitting driving circuit (not shown) of a previous stage SD_n−1. A first direction control signal BICTLB is provided to a gate terminal of the transistor S1, and a second terminal of transistor S1 is connected to a node N11.

The transistor S2 has a first terminal connected to an SR output SSR[n+1] of a unit light emitting driving circuit (not shown) of the next stage SD_n+1. A second direction control signal BICTL is provided to a gate terminal of the transistor S2, and a second terminal of transistor S2 is connected to the node N11.

When the first direction control signal BICTLB is at a gate-on level, the second direction control signal BICTL is at a gate-off level. When the first direction control signal BICTLB is at a gate-off level, the second direction control signal BICTL is at a gate-on level. Accordingly, it can be appreciated that the first direction control signal BICTLB may be complementary to the second direction control signal BICTL.

The transistor S3 has a first terminal connected to the node N11, a gate terminal receiving a first clock signal CLK1, and a second terminal connected to a note N12. The transistor S4 has a double gate structure. The transistor S4 has a source terminal connected to the first power source voltage VGH, a double gate terminal connected to a node N13, and a drain terminal connected to the node N12.

The transistor S5 has a source terminal connected to a first power source voltage VGH, a gate terminal connected to the node N11, and a drain terminal connected to a node N13. The transistor S6 has a gate terminal configured to receive a first reset signal INT1, a source terminal connected to the node N13, and a drain terminal connected to a second power source voltage VGL.

The transistor S7 has a gate terminal connected to the node N13, a source terminal connected to the first power source voltage VGH, and a drain terminal connected to a node N14. The capacitor CHOLD1 is connected between the gate terminal of the transistor S7 and the first power source voltage VGH.

The transistor S8 has a gate terminal connected to the node N12, a first terminal connected to the node N14, and a second terminal configured to receive a second clock signal CLK2. The output capacitor COUT1 is connected between the gate terminal of transistor S8 and the node N14.

The voltage of the node N14 is SR output SSR[n] of the unit scan driving circuit SD_n, and the voltages of the nodes N13 and the N12 are respectively referred to as "Q1" and "QB1."

The SR output SSR[n] is transferred to the unit scan driving circuit of a previous stage SD_n−1 and the unit scan driving circuit of a next stage SD_n+1. When the transistor S7 is turned on, the SR output SSR[n] is at a high level (e.g., a voltage level similar to or the same as the first power source voltage VGH). When the transistor S8 is turned on, the SR output SSR[n] is at a voltage level similar to or the same as a voltage level corresponding to a second clock signal CLK2.

The transistor S9 has a first terminal connected to the SR output SSR[n], a gate terminal configured to receive the second clock signal CLK2, and a second terminal connected to a node N15.

The transistor S10 has a double gate structure. The transistor S10 has a source terminal connected to the first power source voltage VGH, a double gate terminal connected to a node N16, and a drain terminal connected to the node N15.

The transistor S11 has a source terminal connected to the first power source voltage VGH, a gate terminal connected to the node N14, and a drain terminal connected to the node N16. The transistor S12 has a gate terminal configured to receive a second reset signal INT2, a source terminal connected to the node N16, and a drain terminal connected to the second power source voltage VGL.

The transistor S13 has a gate terminal connected to the node N16, a source terminal connected to the first power source voltage VGH, and a drain terminal connected to a node N17. The hold capacitor CHOLD2 is connected between the gate terminal of the transistor S13 and the first power source voltage VGH.

The transistor S14 has a gate terminal connected to the node N15, a first terminal connected to a node N17, and a second terminal configured to receive the first clock signal CLK1. The output capacitor COUT2 is between the gate terminal of the transistor S14 and the node N17.

The voltage of the node N17 is a scan output S[n] of the unit scan driving circuit SD_n, and the voltages of the nodes N16 and N15 are referred to as "Q2" and "QB2."

When the transistor S13 is turned on, the scan output S[n] is at a high level (e.g., a voltage level similar to or the same as the first power source voltage VGH), and when the transistor S14 is turned on, the scan output S[n] is at a voltage level similar to or the same as a voltage level corresponding to the first clock signal CLK1.

Hereinafter, the operation of the unit scan driving circuit SD_n will be described with reference to FIG. 8 according to exemplary embodiments of the present disclosure.

All transistors of the aforementioned unit scan driving circuit SD_n shown in FIG. 7 are p-channel transistors. Accordingly, a low level provided to a gate of the transistors may turn on the transistors. A high level provided to a gate of the transistors may turn off the transistors. However, exemplary embodiments are not limited thereto. For example, in some cases, any other suitable type of transistor and/or threshold voltage levels may be used. It should be appreciated that in the above-noted description of the transistors S1-S14, some of the first terminals of the transistors are a source/drain and the second terminals are a drain/source. Accordingly, if the first terminal is a source terminal, then the second terminal is a drain terminal, and vice-versa.

A unit scan driving circuit of a previous stage SD_n−1 or a next stage SD_n+1 of the unit scan driving circuit SD_n may have different connections relationship from that of FIG. 1. For example, in some cases, a unit light emitting driving circuit of a previous stage SD_n−1 or of a next stage SD_n+1 may have different connections compared to the unit scan driving circuit SD_n shown in FIG. 7. In some cases, the unit light emitting driving circuit of the previous stage SD_n−1 or of the next stage SD_n+1 may have the same connections as the unit light emitting driving circuit stage SD_n shown in FIG. 7.

For example, in the unit scan driving circuit of a previous stage SD_n−1 or a next stage SD_n+1, the second reset signal INT2 may be connected to a transistor corresponding to the transistor S6 instead of the first reset signal INT1, the first clock signal CLK1 may be connected to a transistor corresponding to the transistor S9 instead of the second clock signal CLK2, the first reset signal INT1 may be connected to a transistor corresponding to the transistor S12 instead of the second reset signal INT2, and the second clock signal CLK2 may be connected to a transistor corresponding to the transistor S3 instead of the first clock signal CLK1. In some cases, the second clock signal CLK2 may be connected to a transistor corresponding to the transistor S14 instead of the first clock signal CLK1, and the first clock signal CLK1 may be connected to a transistor corresponding to the transistor S8 instead of the second clock signal CLK2.

Figure 8:
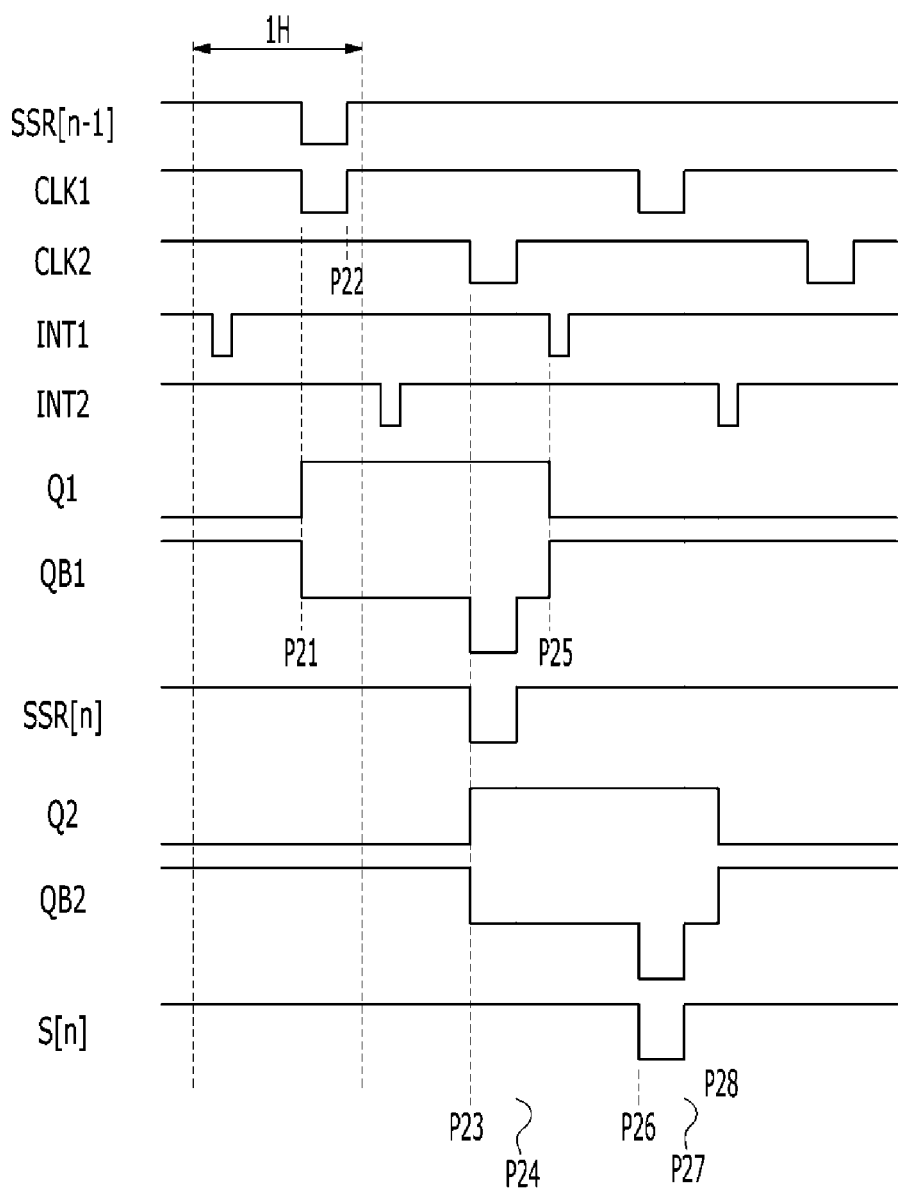
FIG. 8 is a waveform diagram showing voltages of nodes and inputs and outputs of a unit scan driving circuit according to exemplary embodiments of the present disclosure.

FIG. 8 is a waveform diagram showing voltages of nodes and inputs and outputs of a unit scan driving circuit according to exemplary embodiments of the present disclosure.

In FIG. 8, it is assumed that the first direction control signal BICTLB is at a low level, and that the second direction control signal BICTL is at a high level. A low level may correspond to a low reference voltage, such as 0V. A high level may correspond to a higher reference voltage (such as 1V or 3V) relative to the low reference voltage. Also, for the purposes of this disclosure, when a signal or node is described as being at a low level or high level, it should be understood that the voltage at the node (or provided by the signal) is at a low voltage or high voltage, respectively.

Initially, transistor S1 may be turned on by the first direction control signal BICTLB, and transistor S2 may be turned off by the second direction control signal BICTL.

At point of time P21, the SR output SSR[n−1]) and the first clock signal CLK1 are decreased to a low level, and the transistors S3 and S5 may be turned on to decrease QB1 to a midlevel (e.g., between high and low levels) and increase Q1 to a high level. At this point, the voltage at QB1 may not be at a lowest level, and may be between a high level and the lowest level. The transistor S8 is turned on, and the transistor S7 is turned off.

At a point of time P22, the first clock signal CLK1 is increased to a high level so that the transistor S3 is turned off, and the SR output SSR[n−1] is increased to a high level so that the transistor S5 turned off. For a period from P21 to P22, the first power source voltage VGH having a high level is supplied to the node N13 so that Q1 is at a high level. Accordingly, after P22, Q1 may be maintained by the hold capacitor CHOLD1.

For the period from P21 to P22, the SR output SSR[n−1] having a low level is supplied to the node N12 so that QB1 is at a low level. Even after this period, the voltage level at QB1 is maintained by the output capacitor COUT1, so that the transistor S8 is maintained to be turned on and the voltage at SR output SSR[n] corresponds to a voltage level corresponding to the second clock signal CLK2.

At a point of time P23, the second clock signal CLK2 is decreased to a low level, and the SR output SSR[n] is decreased to a low level. The voltage of the node N12 coupled to the node N14 through the output capacitor COUT1 is decreased. As shown in FIG. 8, QB1 is decreased to a low level at the point of time P23.

At the point of time P23, the transistor T9 is turned on by the second clock signal CLK2 having a low level, and the transistor S11 is turned on by the SR output SSR[n]. Accordingly, QB2 is decreased to a midlevel (e.g., between high and low levels), and Q2 is increased to a high level. Accordingly, the transistor S14 is turned on, and the transistor S13 is turned off.

At a point of time P24, the second clock CLK2 is increased to a high level, and the SR output SSR[n] is increased to a high level. The voltage of the node N12 is coupled to the node N14 through the output capacitor COUT1 is increased. Accordingly, as shown in FIG. 8, QB1 is increased to the midlevel at the point of time P24.

At the point of time P24, the second clock CLK2 and the SR output SSR[n] are increased to a high level so that the transistors S9 and S11 are turned off. For a period from P23 to P24, the first power source voltage VGH having a high level is supplied to the node N16 so that Q2 is at a high level. After P24, Q2 is maintained at a high level by the hold capacitor CHOLD2.

For a period from P23 to P24, the SR output SSR[n] having a low level is supplied to the node N15. After P24, QB2 is maintained at the midlevel by the output capacitor COUT2, so that the transistor S14 is maintained to be turned on and the scan output S[n] corresponds to a voltage level of the first clock CLK1.

At a point of time P25, the first reset signal INT1 is decreased to a low level, and the transistor S6 is turned on. Then, the second power source voltage VGL is connected to the node N13 so that Q1 is decreased to a low level and the transistor S4 is turned on, and the node N12 is connected to the first power source voltage VGH so that QB1 is increased to a high level.

At a point of time P26, the first clock signal CLK1 is decreased to a low level, and the scan output S[n] is decreased to a low level. The voltage of the node N15 coupled to the node N17 through the output capacitor COUT2 is also decreased. Accordingly, QB2 is decreased to a low level at the point of time P26.

At a point of time P27, the first clock signal CLK1 is increased to a high level, and the scan output S[n] is increased to a high level. The voltage of the node N15 coupled to the node N17 through the output capacitor COUT2 is also increased. Accordingly, as shown in FIG. 8, QB2 is increased to the midlevel at the point of time P27.

At a point of time P28, the second reset signal INT2 is decreased to a low level, and the transistor S12 is turned on. Then, the second power source voltage VGL is connected to the node N16 so that a voltage at Q2 is decreased to a low level, and the transistor S10 is turned on so that the node N15 is connected to the first power source voltage VGH to thereby increase the voltage at QB2 to a high level.

Hereinafter, a layout of the unit scan driving circuit SD_n in FIG. 7 will be described with reference to FIG. 9 according to exemplary embodiments of the present disclosure.

Figure 9:
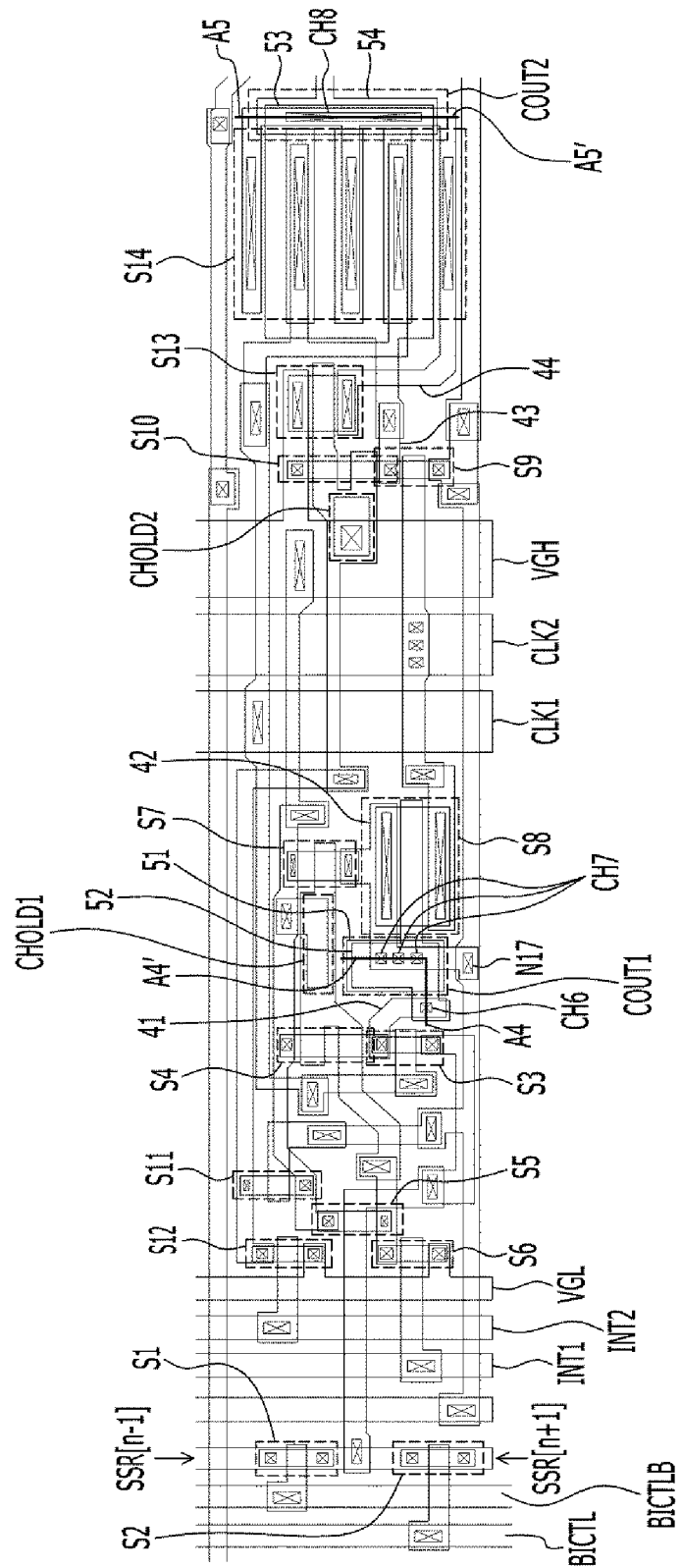
FIG. 9 is a plan layout of a unit scan driving circuit according to exemplary embodiments of the present disclosure.

FIG. 9 is a plan layout of a unit scan driving circuit SD_n according to exemplary embodiments of the present disclosure.

As shown in FIG. 9, the regions at which the transistors S1-S14 are formed are indicated by dotted lines and the reference numerals S1-S14. In FIG. 9, boxes indicated by "x" correspond to contact holes.

In addition, for better understanding and ease of description, in FIG. 9, the wires to which the first power source voltage VGH, the second power source voltage VGL, the first direction control signal BICTLB, the second direction control signal BICTL, the previous SR output SSR[n−1], the next SR output SSR[n+1], the first reset signal INT1, and the second reset signal INT2 are transferred are indicated by using corresponding nomenclature without using additional reference numerals.

Referring to FIG. 9, the output capacitor COUT1 includes an electrode 51 serving as an upper electrode and a gate electrode 52 serving as a lower electrode. The electrode 51 has an area larger than an overlap area of the gate electrode 52 and the electrode 51. The electrode 51 is connected to an electrode 42 through a contact hole CH7, and the electrode 42 is connected to the first terminal of the transistor S8 and the drain terminal of transistor S7 through contact holes. The gate electrode 52 is the gate electrode of the transistor S8, and is connected to the electrode 41 through a contact hole CH6. The electrode 41 is connected to the second terminal of the transistor S3 and the drain terminal of the transistor S4.

Figure 10:
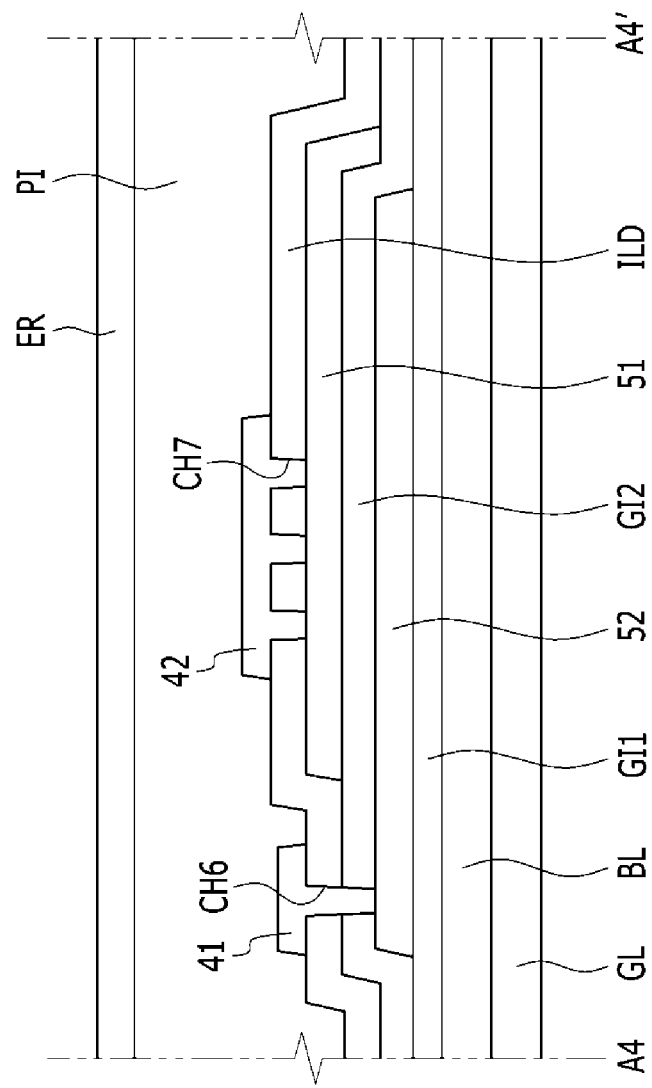
FIG. 10 is a cross-sectional view taken along line A4-A4' of FIG. 9 showing a stacked structure according to exemplary embodiments of the present disclosure.

FIG. 10 is a cross-sectional view taken along line A4-A4' of FIG. 9 showing a layer structure according to exemplary embodiments of the present disclosure.

As shown in FIG. 10, a buffer layer BL is formed on a glass substrate GL, and a gate insulation layer GI1 is formed on the buffer layer BL. A gate electrode 52, serving as the lower electrode, is formed on the gate insulation layer GI1, and a gate insulation layer GI2 is formed on the gate insulation layer GI1 and the gate electrode 52. The electrode 51, serving as the upper electrode, is formed on the gate insulation layer GI2.

An interlayer insulating layer ILD is formed on the electrode 51 and the gate insulation layer GI2, and the electrode 41 is connected to the gate electrode 52 through a contact hole CH6. The electrode 42 is formed on the interlayer insulating layer ILD and connected to the electrode 51 through a contact hole CH7. A protective layer PI may be made of an organic film, and is formed on the interlayer insulating layer ILD and the electrodes 41 and 42. A transparent electrode of the pixel or a cathode electrode of the light emitting element is formed on the protective layer PI. In FIG. 10, a member indicated by a reference numeral "ER" may be a cathode electrode or a pixel electrode of the pixel.

As shown in FIG. 10, the output capacitor COUT1 may be formed at a region where the electrode 51 and the gate electrode 52 are overlapped. The electrode 51 may have a greater area than an overlap area of the electrode 51 and the gate electrode 52. The output capacitor COUT1 shown in FIG. 10 is an example of a structure capable of reducing parasitic capacitance.

The output capacitor COUT2 includes an electrode 54 serving as an electrode and a gate electrode 53 serving as a lower electrode. The electrode 54 has an area larger than an overlap area of the gate electrode 53 and the electrode 54. The electrode 54 is connected to an electrode 44 through a contact hole CH8, and the electrode 44 is connected to the drain terminal of the transistor S13 through a contact hole. The gate electrode 54 is the gate electrode of the transistor S14, and is connected to the electrode 43 through a contact hole. The electrode 43 is connected to the second end of the transistor S9 and the drain terminal of the transistor S10.

Figure 11:
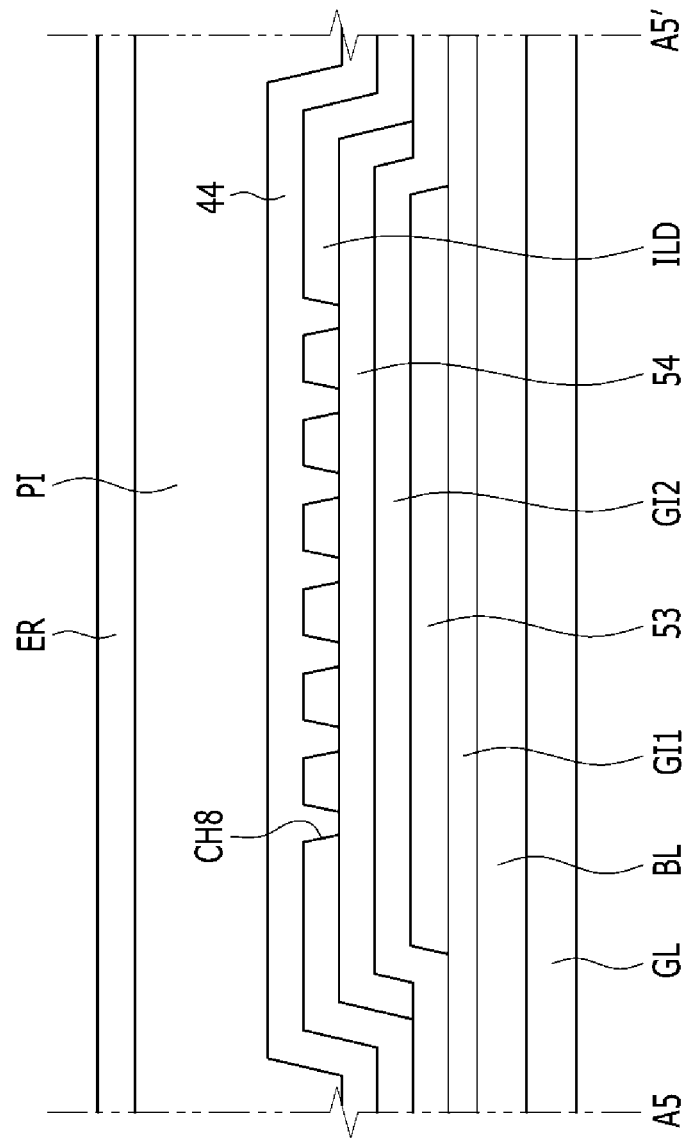
FIG. 11 is a cross-sectional view taken along line A5-A5' of FIG. 9 showing a stacked structure according to exemplary embodiments of the present disclosure.

FIG. 11 is a cross-sectional view taken along line A5-A5' of FIG. 9 showing a layer structure according to exemplary embodiments of the present invention.

As shown in FIG. 11, the buffer layer BL is formed on the glass substrate GL, and the gate insulation layer GI1 is formed on the buffer layer BL. A gate electrode 53, serving as the lower electrode, is formed on the gate insulation layer GI1, and the gate insulation layer GI2 is formed on the gate insulation layer GI1 and the gate electrode 53. The electrode 54, serving as the upper electrode, is formed on the gate insulation layer GI2.

The interlayer insulating layer ILD is formed on the electrode 54 and the gate insulation layer GI2, and the electrode 44 is connected to the gate electrode 54 through a contact hole CH8. The protective layer PI may be made of an organic film, and is formed on the electrode 44. The transparent electrode of the pixel or the cathode electrode of the light emitting element is formed on the protective layer PI. In FIG. 11, a member indicated by a reference numeral "ER" may be a cathode electrode or a pixel electrode of the pixel.

As shown in FIG. 11, the output capacitor COUT2 may be formed at a region where the electrode 54 and the gate electrode 53 are overlapped. The electrode 54 may have a greater area than an overlap area where the electrode 54 and the gate electrode 53 overlap. The output capacitor COUT2 shown in FIG. 10 is an example of a structure capable of reducing parasitic capacitance.

A boosting capacitor connected between a predetermined variable input and a gate of the transistor fully boosts the gate voltage of the transistor by the variable input. However, in the prior art, there is a problem in that a boosting effect is not fully generated because of the parasitic capacitance of the boosting capacitor.

In accordance with the exemplary embodiments, the upper electrode is formed in such a way so as to cover a region where the upper electrode and the lower electrode are overlapped in order to minimize the parasitic capacitance of the boosting capacitor.

Hereinafter, a display device 1 will be described with reference to FIG. 12 according to exemplary embodiments of the present disclosure.

Figure 12:
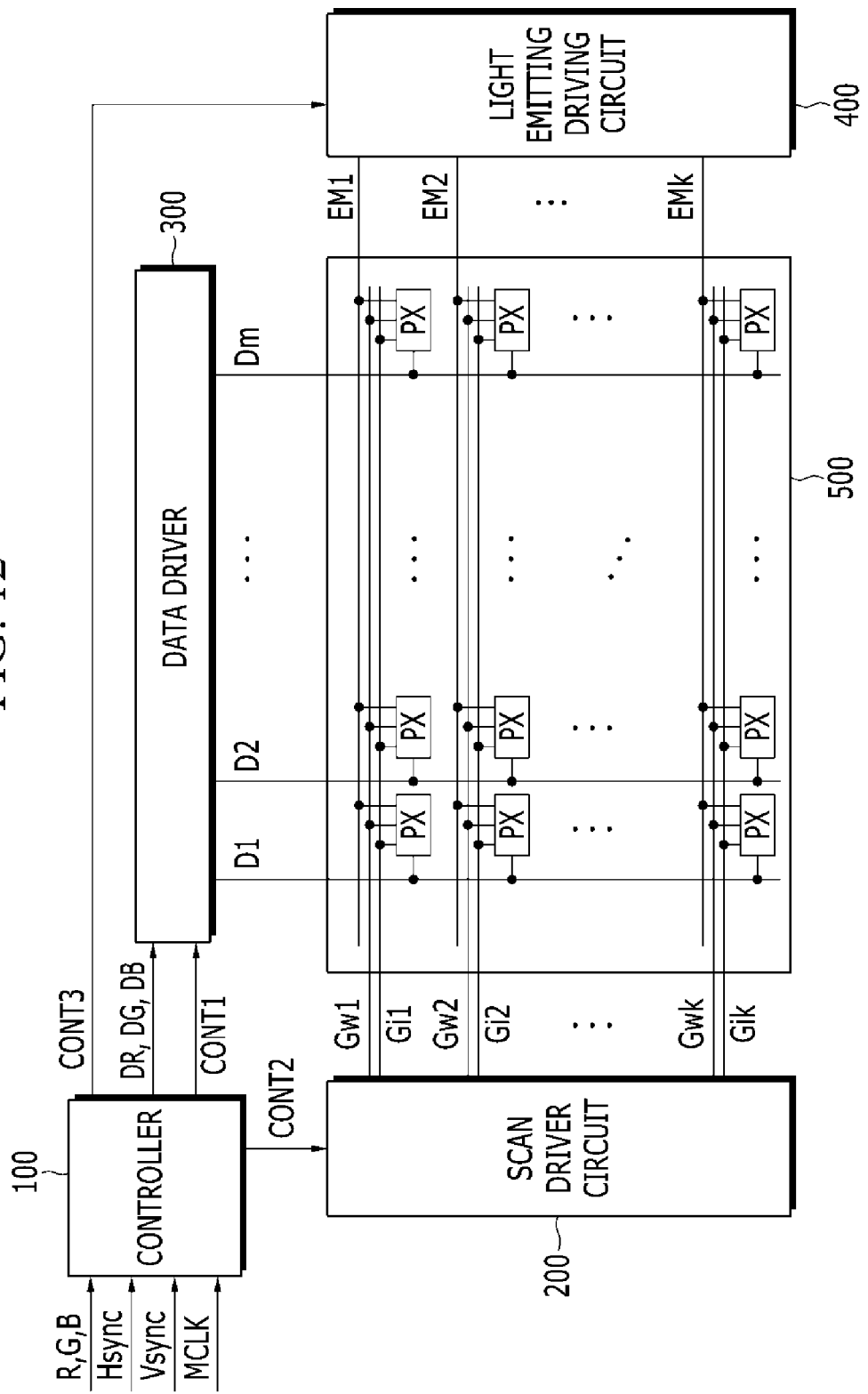
FIG. 12 shows a display device according to exemplary embodiments of the present disclosure.

As shown in FIG. 12, the display device 1 includes a controller 100, a scan driving circuit 200, a data driver 300, a light emitting driving circuit 400, and a display unit 500.

The controller 100 is configured to receive input image signals R, G, and B and input control signals for controlling the display of the display unit 500. The input image signals R, G, and B contain luminance information of each pixel PX, and the luminance information contains data for indicating one of a predetermined number of grays, e.g., 1024 (i.e., $2^{10}$), 256 (i.e., $2^{8}$), or 64 (i.e., $2^{6}$). Examples of the input control signals include a vertical synchronization signal Vsync, a horizontal synchronization signal Hsync, and a main clock signal MCLK.

The controller 100 is configured to process the input image signals R, G, and B, and to generate image data signals DR, DG, and DB, light emission control signals CONT3, scan control signals CONT2, or a data control signal CONT1 based on the input control signals in such a way so as to be suitable for the operating conditions of the data driver 300, the scan driver circuit 200, the light emitting driving circuit 400, and the display unit 500.

The controller 100 can divide the input image signals R, G, and B per frame by being synchronized with a vertical synchronization signal Vsync and per row by being synchronized with a horizontal synchronization signal Hsync, to arrange the image data signals DR, DG, and DB. The controller 100 may transfer a scan control signal CONT2 to the scan driving circuit 200, and a data control signal CONT1 and image data signals DR, DG, and DB to the data driver 300.

The scan driving circuit 200 may respectively transfer a plurality of scan signals to a plurality of scan lines Gi1-Gik and Gw1-Gwk based on the scan control signals CONT2 (where k is any whole number greater than 1). The scan control signals CONT2 may include the BICTL, BICTLB, CLK1, CLK2, INT1, and INT2 signals described hereinabove. The scan control signals CONT2 may also include a scan start signal.

The data driver 300 may generate a plurality of data signals corresponding to the image data signals DR, DG, and DB, and may transfer the image data signals DR, DG, and DB to a plurality of data lines D1-Dm based on the data control signal CONT1.

The light emitting driving circuit 400 may transfer a plurality of light emitting signals to a plurality of light emission control lines EM1-EMk based on the light emission control signals CONT3. The light emission control signals CONT3 may include the BICTL, BICTLB, EM_INT1, EM_INT2, EM_CLK1, and EM_CLK2 signals described hereinabove. The light emission control signals CONT3 may also include a light emitting start signal.

The display unit 500 includes a plurality of data lines D1-Dm (where m is any whole number greater than 1) extending in a column direction, a plurality of scan lines Gi1-Gik and Gw1-Gwk extending in a row direction, a plurality of light emission control lines EM1-EMk extending in a row direction, and a plurality of pixels PX. The data lines D1-Dm, the scan lines Gi1-Gik and Gw1-Gwk, and the light emission control lines EM1-EMk are connected to the plurality of pixels PX.

Each of the pixels PX can include at least one of red, green, and blue color filters R, G, and B. A plurality of data voltages corresponding to the image data signals DR, DG, and DB may be transferred to the pixels PX through the data lines D1-Dm. A plurality of scan signals for selecting the pixels PX of a row unit may be transferred to the pixels PX through the scan lines Gi1-Gik and Gw1-Gwk. A plurality of light emitting signals for controlling the light emission of the pixels of the row unit are transferred to the pixels PX through the light emission control lines EM1-EMk.

Figure 13:
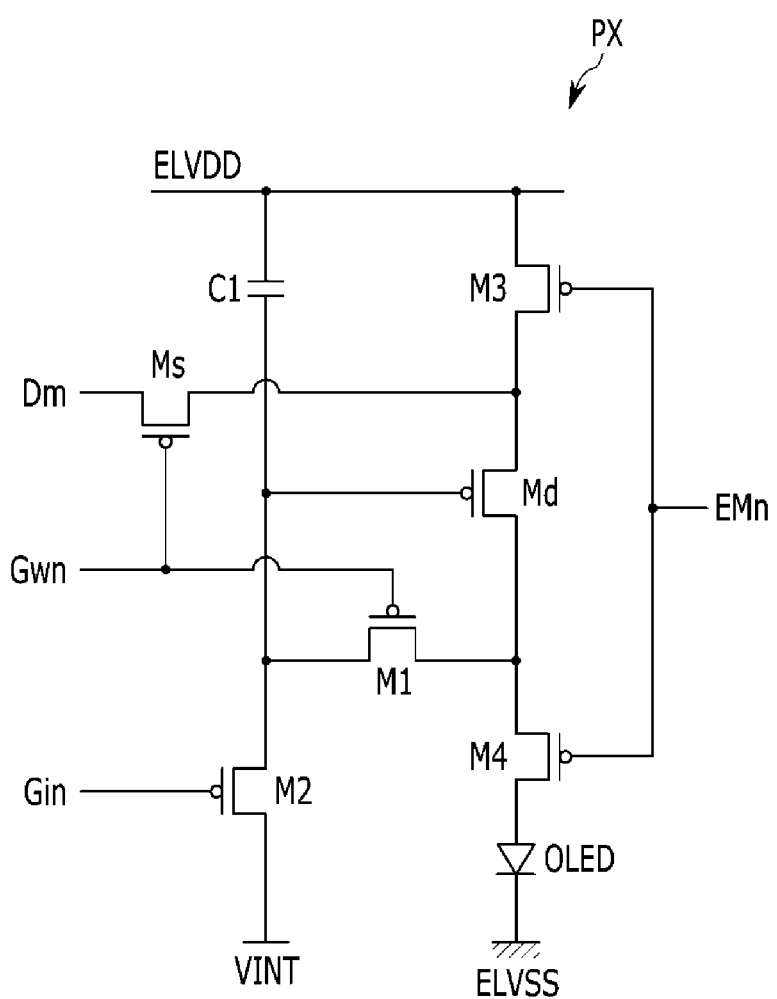
FIG. 13 shows an example of one of a plurality of pixels according to exemplary embodiments of the present disclosure.

FIG. 13 shows an example of one of the plurality of pixels according to exemplary embodiments of the present invention.

Referring to FIG. 13, one pixel PX may be connected to $n^{th}$ scan lines Gin and Gwn, an $n^{th}$ light emission control line EMn, and an $m^{th}$ data line.

The pixel PX may include a switching transistor Ms, a driving transistor Md, a plurality of transistors M1-M4, a capacitor C1, and an organic light emitting diode (OLED). In FIG. 13, the transistors Ms, Md, and M1-M4 are shown to be PMOS (p-channel metal oxide semiconductor) transistors as transistors of a p-channel type, but other transistors may be employed instead of the PMOS transistor.

The switching transistor Ms has a gate terminal connected to the scan line Gwn, a first terminal connected to the data line Dm, and a second terminal connected to a source terminal of the driving transistor Md. The switching transistor Ms may transfer, to a source terminal of the driving transistor Md, a data voltage provided by data line Dm when the switching transistor Ms turns on based on a low level of a scan signal applied to the scan line Gwn.

The driving transistor Md has a source terminal to which a data voltage is transferred while the switching transistor Ms is turned on, a gate terminal connected to a first electrode of a capacitor C1, and a drain terminal connected to a source terminal of the transistor M4. A second electrode of the capacitor C1 is connected to a power line providing a power source voltage ELVDD.

The transistor M1 has a gate terminal connected to the scan line Gwn, a first terminal connected to a gate electrode of the driving transistor Md, and a second terminal connected to a drain electrode of the driving transistor Md. The transistor M1 is turned on when the scan signal applied to the scan line Gwn is at a low level. When transistor M1 is turned, driving transistor Md may operate as a diode-connected transistor.

The transistor M2 has a gate terminal connected to the scan line Gin, a first terminal connected to a reset voltage VINT, and a second terminal connected to the gate terminal of the driving transistor Md.

The transistor M3 has a gate terminal connected to the light emission control line En, a source terminal connected to a power line supplying a voltage ELVDD, and a drain terminal connected to the source terminal of the driving transistor Md.

The transistor M4 has a gate terminal connected to the light emission control line En, a first terminal connected to the drain electrode of the driving transistor Md, and a second terminal connected to an anode of the OLED. A cathode of the OLED is connected to a power line supplying a voltage ELVSS. The OLED may emit light according to a current flowing through the driving transistor Md when the transistors M3 and M4 are turned on by the light emitting signals. It should also be understood that voltages ELVDD and ELVSS may be set to various different types of voltages. In some cases, voltage ELVDD may be greater than the voltage ELVSS. In some cases, voltage ELVSS may be a ground node (e.g., 0V).

Figure 14:
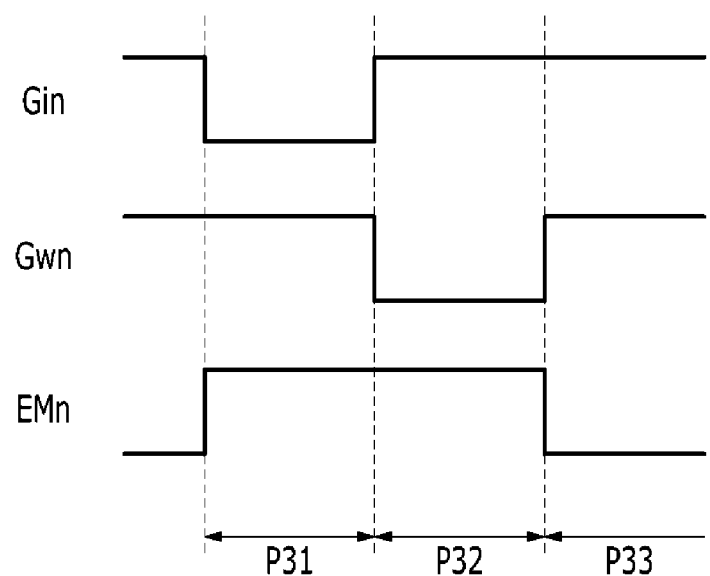
FIG. 14 shows a drive timing graph for explaining an operation of the pixel shown in FIG. 13 according to exemplary embodiments of the present disclosure.

FIG. 14 shows drive timing graph for explaining an operation of the pixel PX shown in FIG. 13 according to exemplary embodiments of the present disclosure.

As shown in FIG. 14, at a period of time P31, a scan signal having a low level is applied to the scan line Gin. The transistor M2 is accordingly turned on, so that a voltage VINT is applied to the gate electrode of transistor Md. The capacitor C1 is charged by a voltage obtained by subtracting VINT from ELVDD since the capacitor's top electrode is connected to a power supply line providing voltage ELVDD and the capacitor's bottom electrode is connected to a line providing a voltage VINT.

Next, at a period of time P32, a scan signal having a low level is applied to the scan line Gwn. Then, the switching transistor Ms and the transistor M1 is turned on. Once the transistor M1 is turned on, the driving transistor Md is under a diode-connection state. Accordingly, in the small signal equivalent model of transistor Md, the voltage between the gate and the source of the transistor Md becomes a threshold voltage of the transistor Md.

Moreover, a data voltage is applied from the data line Dm to the source of the driving transistor Md through the turned on switching transistor Ms. When the data voltage from the data line Dm is Vdata and the threshold voltage of the driving transistor Md is Vth (a negative voltage), the gate voltage of the driving transistor Md becomes Vdata+Vth. Then, the capacitor C1 is charged by a voltage obtained by ELVDD-(Vdata+Vth).

Next, at a period of time P33, a light emitting signal having a low level is applied to the light emission control line EMn. Then, the transistors M3 and M4 are turned on, and a driving current flowing according to a voltage difference (Vgs=(Vdata+Vth)-ELVDD)) between the gate and the source of the driving transistor Md is transferred to the OLED. In this case, the driving current is obtained by the following Equation 1.

$$I_{OLED} = \frac{\beta}{2}(Vgs - Vth)^2 = \frac{\beta}{2}((Vdata + Vth - ELVDD) - Vth)^2 = \frac{\beta}{2}(Vdata - ELVDD)^2 \quad \text{(Equation 1)}$$

Herein, $I_{OLED}$ indicates a current flowing in the OLED through the driving transistor Md, and $\beta$ is a constant value that is proportional to the aspect ratio and oxide capacitance associated with transistor Md.

Generally, a deviation is generated in each pixel PX due to the non-uniformity of the manufacturing process so that the amount of the current supplied to the OLED is varied. Accordingly, the light emitting luminance is varied. However, according to exemplary embodiments of the present disclosure, as can be appreciated from Equation 1, even though the threshold voltages of the driving transistors Md located at each pixel PX may be different from each other, the effect of these threshold voltages is the same (i.e., the threshold voltage of transistor Md does not affect the current supplied to the OLED). Accordingly, it is possible to supply a constant current to the OLED. This can solve the problem of the luminance imbalance of the pixels PX at different locations.

The light emitting driving circuit 400 may include a plurality of unit light emitting driving circuits ED_n (see FIG. 1). In addition, the scan driving circuit 200 may include a plurality of unit scan driving circuits SD_n. Each of the scan signals transferred to the scan lines Gi1-Gin is a signal corresponding to SSR[n] or the output of the previous unit scan driving circuit. Each of the scan signals transferred to the scan lines Gw1-Gwn may be a signal corresponding to S[n].

Accordingly, a light emitting driving circuit and a scan driving circuit, and a display device including the same, which can ensure boosting by connecting a capacitor having a structure capable of reducing a parasitic capacitance of a boosting transistor, have been described hereinabove.

In FIGS. 12, 13, and 14, although the display device including a light emitting driving circuit, a scan driving circuit, and pixels has been described, exemplary embodiments are not limited thereto. For example, the display device may include any one of the light emitting driving circuit and the scan driving circuit. In addition, the pixel includes the transistor performing the switching operation according to the light emission control signal, but, in some cases, the pixel may not include such a transistor. Furthermore, it should be understood that the idealized behavior of capacitors and transistors has been described; however, variations to the described behavior may occur. For example, slight discharges in voltage levels of a capacitor have not been shown, and instead, an idealized constant voltage level of the capacitor is shown in the figures. Furthermore, it should be understood that a dielectric may separate an upper and lower electrode of a capacitor. The dielectric may be an insulator. Accordingly, a capacitor may be formed by disposing two conductive layers separated by an insulation layer.

It will be apparent to those skilled in the art that various modifications and variations can be made in the present disclosure without departing from the spirit or scope of the disclosed subject matter. Thus, it is intended that the present disclosure cover the modifications and variations of the disclosed subject matter provided they come within the scope of the appended claims and their equivalents.

What is claimed is:

1. A light emitting driving circuit, comprising:
a plurality of unit light emitting driving circuits configured to provide light emission control signals,
wherein at least one of the unit light emitting driving circuits comprises:
a first capacitor having a first upper electrode comprising a first terminal connected to a gate terminal of a first transistor connected to a node configured to provide a first light emission control signal, and the first transistor being configured to set the first light emission control signal to a first level according to a first light emitting clock signal received at a first lower electrode comprising a second terminal of the first capacitor;
a second transistor comprising a first terminal coupled to the gate terminal of the first transistor and a second terminal configured to receive a first light emitting reset signal; and
a second capacitor connected between a pate terminal of the second transistor and the first terminal of the second transistor,
wherein the first upper electrode having an area greater than a first overlap area, the first overlap area being an area where the first lower electrode and the first upper electrode overlap.

2. The light emitting driving circuit of claim 1, wherein the second capacitor comprises a second upper electrode and a second lower electrode, the second upper electrode having an area greater than a second overlap area, the second overlap area being an area where the second lower electrode and the second upper electrode overlap.

3. The light emitting driving circuit of claim 1, wherein the at least one of the unit light emitting driving circuits further comprises:
a third transistor comprising a first terminal connected to the first light emitting clock signal, and a gate terminal connected to a node providing a first input, the first input being provided according to a second light emitting clock signal; and
a third capacitor connected between the gate terminal of the third transistor and a second terminal of the third transistor,
wherein the third capacitor comprises a third upper electrode and a third lower electrode, the third upper electrode having an area greater than a third overlap area, the third overlap area being an area where the third lower electrode and the third upper electrode overlap, and
wherein the first input is provided from a unit light emitting driving circuit located in an adjacent stage of the unit light emitting driving circuits.

4. A light emitting driving circuit, comprising:
a plurality of unit light emitting driving circuits configured to provide light emission control signals,
wherein at least one of the unit light emitting driving circuits comprises:
a first transistor having a gate terminal connected to a node providing a first input, the first input being provided from a unit light emitting driving circuit located in an adjacent stage of the unit light emitting driving circuit according to a second light emitting clock signal, the first transistor having a first terminal configured to receive a first light emitting clock signal; and
a first capacitor connected between the gate terminal of the first transistor and a second terminal of the first transistor;
a second transistor comprising a first terminal coupled to the gate terminal of the first transistor and a second terminal configured to receive a first light emitting reset signal;
a second capacitor connected between the gate terminal of the second transistor and the first terminal of the second transistor, and
wherein the first capacitor comprises a first upper electrode and a first lower electrode, the first upper electrode having an area greater than a first overlap area, the first overlap area being an area where the first lower electrode and the first upper electrode overlap.

5. The light emitting driving circuit of claim 4, wherein the second terminal of the first transistor is connected to a node configured to provide a first output.

6. The light emitting driving circuit of claim 4, wherein the second capacitor comprises a second upper electrode and a second lower electrode, the second upper electrode having an area greater than a second overlap area, the second overlap area being an area where the second lower electrode and the second upper electrode overlap.

7. A light emitting driving circuit, comprising:
a plurality of unit light emitting driving circuits configured to provide light emission control signals,
wherein at least one of the unit light emitting driving circuits comprises:
a first transistor connected to a node configured to provide a first light emission control signal;
a first capacitor having a first terminal coupled to a node providing a light emission control signal and a second terminal connected to a gate terminal of the first transistor;
a second transistor having a first terminal coupled to a gate terminal of the first transistor and a second terminal configured to receive a first light emitting reset signal; and
a second capacitor connected between a gate terminal of the second transistor and the first terminal of the second transistor, and
wherein the second capacitor comprises a second upper electrode and a second lower electrode, the second upper electrode having an area greater than an overlap area, the overlap area being an area where the second lower electrode and the second upper electrode overlap.

8. A display device, comprising:
a plurality of pixels controlled by a plurality of light emission control signals; and
a light emitting driving circuit comprising a plurality of unit light emitting driving circuits configured to provide the light emission control signals,
wherein at least one of the unit light emitting driving circuits comprises:
a first transistor comprising a gate terminal connected to a node configured to provide a first light emission control signal;

a second transistor comprising a first terminal coupled to the gate terminal of the first transistor and a second terminal configured to receive a first light emitting reset signal;

a first capacitor comprising:
- a first electrode connected to the gate terminal of the first transistor;
- an insulation layer disposed on the first electrode; and
- a second electrode disposed on the insulation layer, and wherein the second electrode has an area greater than an overlap area, the overlap area being an area where the first electrode and the second electrode overlap; and a second capacitor connected between a gate terminal of the second transistor and the first terminal of the second transistor.

9. The display device of claim 8, wherein the the second capacitor comprises a second upper electrode and a second lower electrode, the second upper electrode having an area greater than an overlap area, the overlap area being an area where the second lower electrode and the second upper electrode overlap.

* * * * *